United States Patent
Nagai

(10) Patent No.: US 8,658,493 B2
(45) Date of Patent: Feb. 25, 2014

(54) MANUFACTURING METHOD OF SEMICONDUCTOR DEVICE

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 344 days.

(21) Appl. No.: 12/539,200

(22) Filed: Aug. 11, 2009

(65) Prior Publication Data

US 2009/0298203 A1 Dec. 3, 2009

Related U.S. Application Data

(63) Continuation of application No. PCT/JP2007/055662, filed on Mar. 20, 2007.

(51) Int. Cl.
*H01L 21/8239* (2006.01)
*H01L 23/528* (2006.01)
*H01L 29/92* (2006.01)

(52) U.S. Cl.
USPC ............... 438/256; 438/3; 438/240; 438/396

(58) Field of Classification Search
None
See application file for complete search history.

(56) References Cited

U.S. PATENT DOCUMENTS

| | | | |
|---|---|---|---|
| 6,509,593 B2 | 1/2003 | Inoue et al. | |
| 6,573,111 B2 | 6/2003 | Nagano et al. | |
| 6,913,970 B2 | 7/2005 | Inoue et al. | |
| 7,507,621 B2 | 3/2009 | Miura | |
| 7,576,377 B2 * | 8/2009 | Hayashi | 257/295 |
| 2002/0000589 A1 | 1/2002 | Nagano et al. | |
| 2002/0011616 A1 | 1/2002 | Inoue et al. | |
| 2002/0155663 A1 | 10/2002 | Nagano et al. | |
| 2003/0080364 A1 | 5/2003 | Inoue et al. | |
| 2003/0089954 A1 * | 5/2003 | Sashida | 257/369 |
| 2005/0285173 A1 * | 12/2005 | Nagai et al. | 257/296 |
| 2007/0048963 A1 * | 3/2007 | Miura | 438/396 |

FOREIGN PATENT DOCUMENTS

| | | | |
|---|---|---|---|
| JP | 2000-164827 A | 6/2000 | |
| JP | 3165093 B2 | 5/2001 | |
| JP | 2002-009256 A | 1/2002 | |
| JP | 2006-49795 A | 2/2006 | |
| JP | 2006-202988 A | 8/2006 | |
| JP | 2007-067241 A | 3/2007 | |

OTHER PUBLICATIONS

Notification of Transmittal of Translation of the International Preliminary Report on Patentability (Form PCT/IB/373) of International Application No. PCT/JP2007/055662 mailed Oct. 1, 2009 with Forms PCT/IB/373 and PCT/ISA/237.
International Search Report of PCT/JP2007/055662, Mailing Date of May 15, 2007.

* cited by examiner

*Primary Examiner* — Zandra Smith
*Assistant Examiner* — Pamela E Perkins
(74) *Attorney, Agent, or Firm* — Fujitsu Patent Center

(57) ABSTRACT

An aluminum oxide film covering a ferroelectric capacitor is formed. Next, an opening (51*t*) where a portion of a top electrode is exposed and an opening (51*b*) where a portion of a bottom electrode is exposed are formed in the aluminum oxide film. Thereafter, films (23 to 26) are formed and a resist pattern (92) is formed. Then, etching of the films (23 to 26) is performed with using the resist pattern (92) as a mask thereby forming contact holes (27*t*) and (27*b*). At this time, since the openings (51*t*) and (51*b*) are formed in the aluminum oxide film, the aluminum oxide film is not required to be processed. Consequently, the contact holes (27*t*) and (27*b*) can be formed easily.

14 Claims, 26 Drawing Sheets

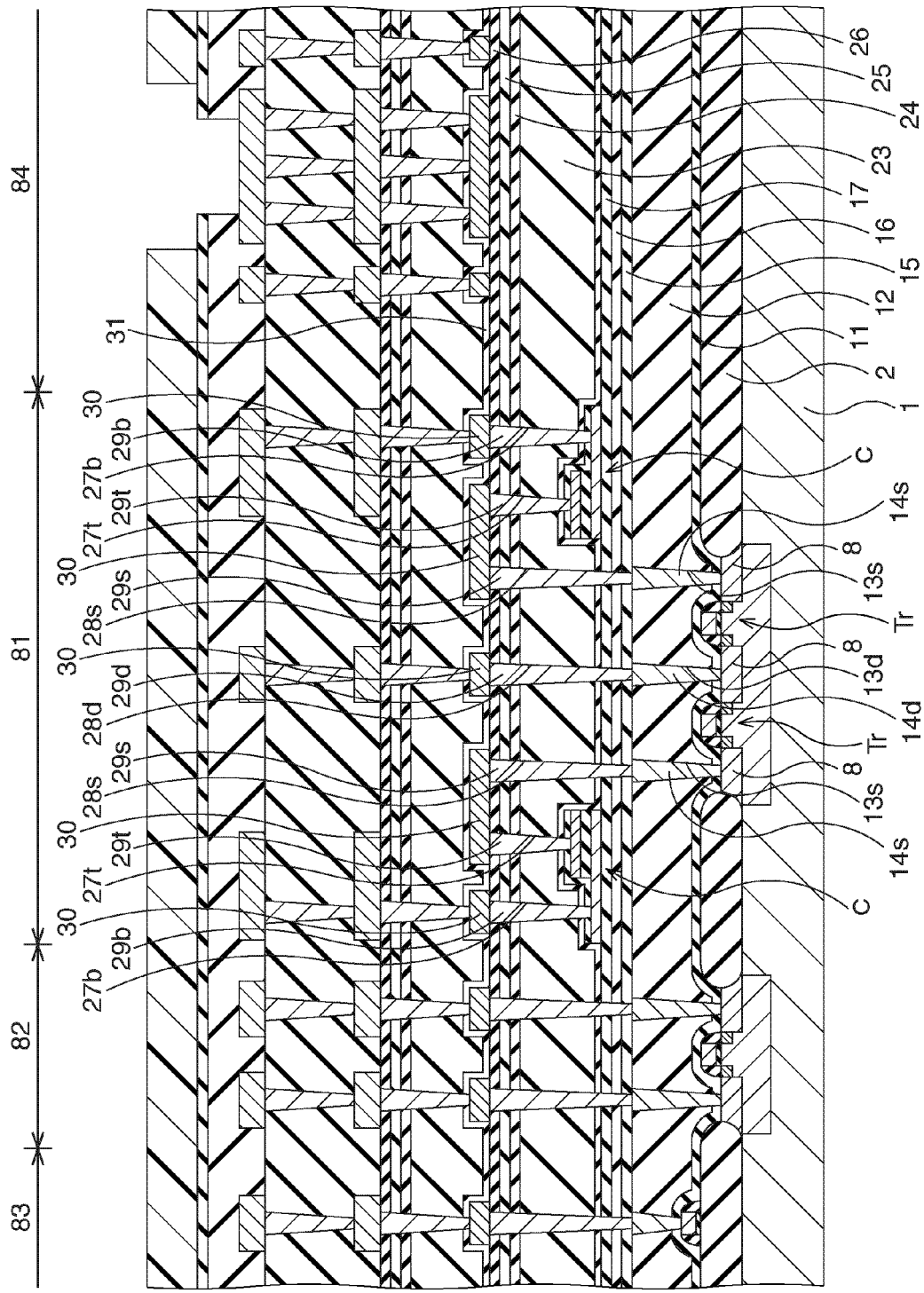

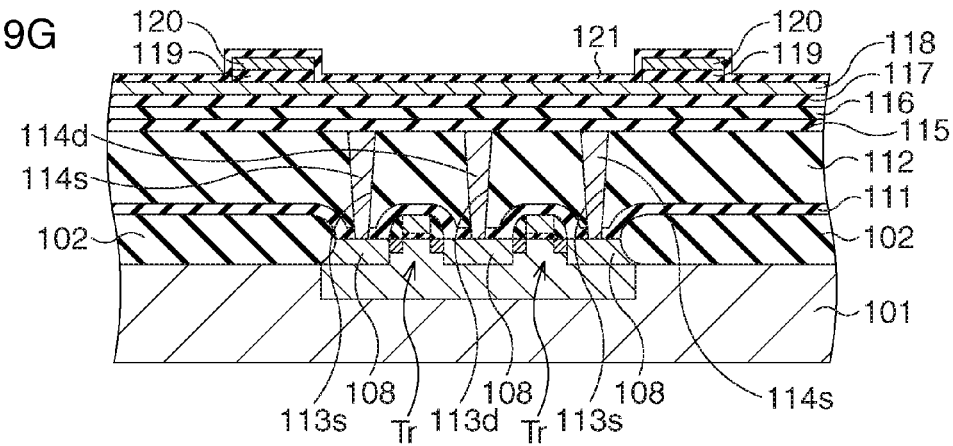
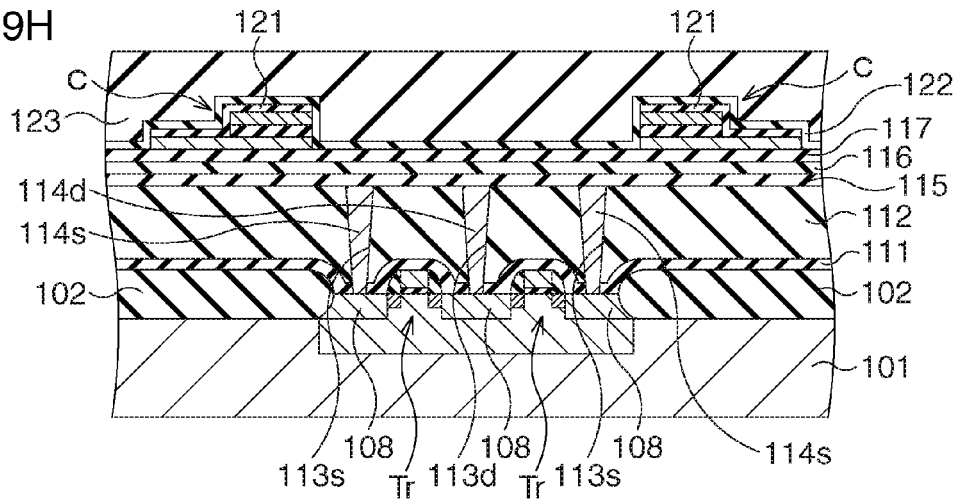
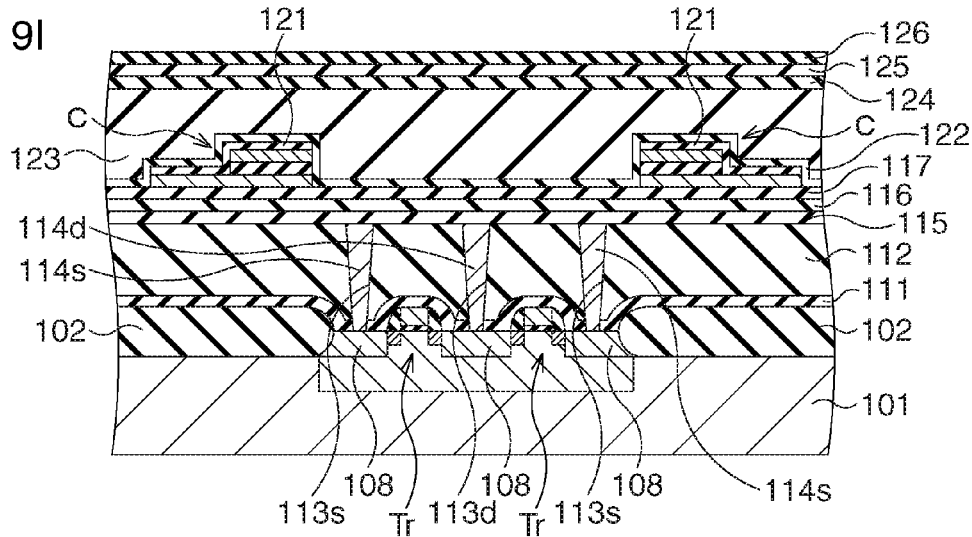

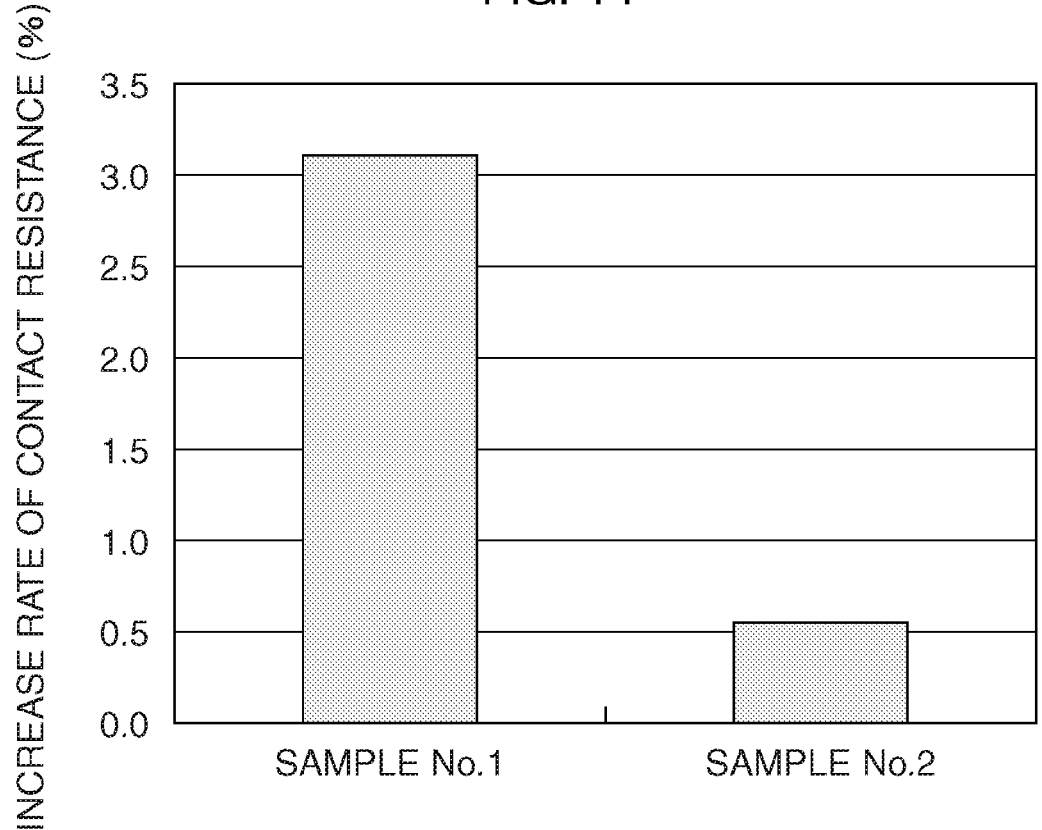

MANUFACTURING METHOD OF SEMICONDUCTOR DEVICE

CROSS REFERENCE TO RELATED APPLICATIONS

This application is a Continuation of International Application No. PCT/JP2007/055662, with an international filing date of Mar. 20, 2007, which designating the United States of America, the entire contents of which are incorporated herein by reference.

TECHNICAL FIELD

The present invention relates to a manufacturing method of a semiconductor device suitable for a ferroelectric memory.

BACKGROUND ART

In recent years, development of a ferroelectric memory (FeRAM) retaining information in a ferroelectric capacitor by making use of a polarization inversion of a ferroelectric substance has been in progress. The ferroelectric memory is a nonvolatile memory in which retained information does not disappear even when power is turned off, and a high integration, a high-speed driving, a high durability, and a low power consumption can be realized.

As a material of a ferroelectric film constituting the ferroelectric capacitor, a ferroelectric oxide having a perovskite crystal structure such as PZT (Pb (Zr, Ti) $O_3$), SBT ($SrBi_2Ta_2O_9$) whose amount of remanent polarization is large has been mainly used. The amount of remanent polarization of PZT is approximately 10 $\mu C/cm^2$ to 30 $\mu C/cm^2$. However, characteristics of the ferroelectric film are likely to be deteriorated by moisture penetrating from outside through an interlayer insulating film, such as a silicon oxide film, having high affinity with water. That is, in performing a high temperature process such as forming the interlayer insulating film or metal wirings, the moisture is decomposed to hydrogen and oxygen, and this hydrogen penetrates into the ferroelectric film to react with oxygen constituting the ferroelectric film, resulting that oxygen deficiency in the ferroelectric film is caused. As a result, crystallinity of the ferroelectric film is lowered.

Further, using the ferroelectric memory for a long time also causes crystallinity to be lowered due to the penetration of hydrogen into the ferroelectric film. As a result, the amount of remanent polarization and a dielectric constant of the ferroelectric film are lowered, and therefore, performance of the ferroelectric capacitor is lowered. There is also a case that performance of not only the ferroelectric capacitor but also a transistor and the like positioned therebelow is lowered.

Thus, in a conventional ferroelectric memory, in order to suppress diffusion of moisture and hydrogen, an aluminum oxide film is formed on various locations. There are, for example, a ferroelectric memory in which an aluminum oxide film covering a ferroelectric capacitor is formed, a ferroelectric memory in which an aluminum oxide film is formed above wirings, a ferroelectric memory in which a flat aluminum oxide film is formed above a ferroelectric capacitor, and so on.

Here, a conventional manufacturing method of a ferroelectric memory will be explained. FIG. 9A to FIG. 9M are cross-sectional views showing a conventional manufacturing method of a ferroelectric memory in order of steps.

First, as illustrated in FIG. 9A, an element isolation insulating film 102 is formed on a surface of a semiconductor substrate 101 composed of silicon or the like. Next, an ion implantation of B (boron) is performed in the surface of an element region demarcated by the element isolation insulating film 102 thereby forming a P-well 103. Next, gate insulating films 104 and gate electrodes 105 are formed on the P-well 103. Thereafter, an ion implantation of P (phosphorus) is performed in the surface of the P-well 103 thereby forming shallow impurity diffusion layers 106. Subsequently, sidewall insulating films 107 are formed on lateral sides of the gate electrodes 105. Next, an ion implantation of As (arsenic) is performed in the surface of the P-well 103 thereby forming deep impurity diffusion layers 108. Thus, transistors Tr are formed. Note that the single transistor Tr includes the two impurity diffusion layers 108, and one of them is shared with another transistor Tr. The impurity diffusion layer 108 that is shared constitutes a drain, and the impurity diffusion layer 108 that is not shared constitutes a source.

Next, as illustrated in FIG. 9B, a silicon oxynitride film 111 covering the transistors Tr is formed, and an NSG film 112 is formed thereon with using TEOS. Next, a surface of the NSG film 112 is flattened.

Thereafter, as illustrated in FIG. 9C, a resist pattern 191 having openings at positions matching with the impurity diffusion layers 108 is formed on the NSG film 112. Then, etching of the NSG film 112 and so on is performed with using the resist pattern 191 as a mask thereby forming contact holes 113s reaching the sources and a contact hole 113d reaching the drain.

Subsequently, as illustrated in FIG. 9D, the resist pattern 191 is removed. Next, a barrier metal film (not-illustrated) is formed on the entire surface, and a tungsten film (not-illustrated) is formed thereon. Then, the tungsten film and the barrier metal film are polished until the NSG film 112 is exposed. As a result, contact plugs 114s are formed in the contact holes 113s, and a contact plug 114d is formed in the contact hole 113d. Next, plasma annealing is performed in a nitrogen atmosphere, and thereby the surface of the NSG film 112 is nitrided. Thereafter, a silicon oxynitride film 115 is formed on the NSG film 112.

Subsequently, as illustrated in FIG. 9E, an NSG film 116 is formed on the silicon oxynitride film 115 with using TEOS, and then a dehydration treatment thereof is performed. Next, an aluminum oxide film 117 is formed on the NSG film 116 and then a heat treatment (RTA) is performed.

Next, as illustrated in FIG. 9F, a platinum film 118, a PZT film 119, and an iridium oxide film 120 are formed sequentially on the aluminum oxide film 117. A heat treatment (RTA) is performed between forming the PZT film 119 and forming the iridium oxide film 120. Further, the iridium oxide film 120 has a two-layer structure, and a heat treatment (RTA) is also performed after the lower layer is formed.

Thereafter, as illustrated in FIG. 9G, the iridium oxide film 120 is patterned, and then recovery annealing is performed. Subsequently, the PZT film 119 is patterned, and then recovery annealing is performed. Next, an aluminum oxide film 121 is formed on the entire surface, and then recovery annealing is performed.

Subsequently, as illustrated in FIG. 9H, the aluminum oxide film 121 and the platinum film 118 are patterned. Thus, ferroelectric capacitors C are formed. Thereafter, recovery annealing is performed. Further, an aluminum oxide film 122 is formed on the entire surface, and then recovery annealing is performed. Subsequently, an NSG film 123 is formed on the aluminum oxide film 122 with using TEOS, and then the surface thereof is flattened.

Next, plasma annealing is performed in a nitrogen atmosphere, and thereby the surface of the NSG film 123 is nitrided. Next, as illustrated in FIG. 9I, an NSG film 124 is formed on the NSG film 123 with using TEOS, and then plasma annealing is performed in a nitrogen atmosphere, so that the surface of the NSG film 124 is nitrided. Thereafter, an aluminum oxide film 125 is formed on the entire surface. Subsequently, an NSG film 126 is formed on the aluminum oxide film 125 with using TEOS, and then plasma annealing is performed in a nitrogen atmosphere, so that the surface of the NSG film 126 is nitrided.

Next, as illustrated in FIG. 9J, a resist pattern 192 having openings at predetermined positions is formed on the NSG film 126. Then, etching of the NSG film 126 and so on is performed with using the resist pattern 192 as a mask thereby forming contact holes 127t reaching top electrodes (the iridium oxide film 120) and contact holes 127b reaching bottom electrodes (the platinum film 118).

Next, as illustrated in FIG. 9K, the resist pattern 192 is removed, and then recovery annealing is performed. Thereafter, a resist pattern 193 having openings at predetermined positions is formed on the NSG film 126. Then, etching of the NSG film 126 and so on is performed with using the resist pattern 193 as a mask thereby forming contact holes 128s reaching the contact plugs 114s and a contact hole 128d reaching the contact plug 114d.

Thereafter, as illustrated in FIG. 9L, the resist pattern 193 is removed. Subsequently, a barrier metal film (not-illustrated) is formed on the entire surface, and a tungsten film is formed thereon. Then, the tungsten film and the barrier metal film are polished until the NSG film 126 is exposed. As a result, contact plugs 129t are formed in the contact holes 127t, and contact plugs 129b are formed in the contact holes 127b. Further, contact plugs 129s are formed in the contact holes 128s, and a contact plug 129d is formed in the contact hole 128d. Next, plasma annealing is performed in a nitrogen atmosphere, and thereby the surface of the NSG film 126 is nitrided.

Next, as illustrated in FIG. 9M, wirings 130 in contact with the contact plugs 129t, 129b, 129s, and 129d are formed. Thereafter, a heat treatment is performed in a nitrogen atmosphere. Subsequently, an aluminum oxide film 131 is formed on the entire surface. Thereafter, upper layer wirings and so on are formed.

However, in the conventional method, as illustrated in FIG. 10A, after the resist pattern 193 is removed, substances 194 deteriorated from the resist pattern 193 are likely to be left in the contact holes 127t and 127b. This phenomenon is prominent in particular in the case when the aluminum oxide film 125 functioning as a hydrogen barrier film is formed above the ferroelectric capacitor. Therefore, as illustrated in FIG. 10B, the substances 194 are intervened between the contact plugs 129t and 129b and the top electrode and the bottom electrode, and contact resistances at these portions are likely to be increased. If ashing time and power for removing the resist pattern 193 are increased, it may possible to prevent the substances 194 from being left, but the ferroelectric capacitor C is affected.

Note that it can be considered that the contact plugs 129t and 129b are formed before the resist pattern 193 is formed, but in this case, plasma damage is likely to be caused to the ferroelectric capacitor C. Further, it is also difficult to recover this damage.

Further, it is also possible to consider that before the contact holes 127t and 127b are formed, the contact holes 128s and 128d and the contact plugs 129t and 129b are formed, but in this case, an oxidation preventing film for the contact plugs 129t and 129b, which is, for example, an aluminum oxide film, is required to be formed.

Therefore, the number of films whose etching rate is lower than that of a silicon oxide film is increased, and etching for forming the contact holes 127t and 127b becomes difficult to be performed. Then, lower portions of the contact holes 127t and 127b become too thin and/or variation in size of the contact holes 127t and 127b is likely to occur. Consequently, it is difficult to stabilize the characteristics such as the contact resistance.

Note that Patent Document 1 discloses an art in which after a conductive plug reaching a bottom electrode and a conductive plug reaching a semiconductor substrate are formed, a conductive plug reaching a top electrode is formed. However, in this art, a supply path for oxygen to a ferroelectric capacitor is not sufficient therefore being difficult to perform recovery annealing. Further, in forming an opening reaching the top electrode, there is a case that damage is caused to the ferroelectric capacitor via the conductive plug reaching the bottom electrode. Further, there are not many hydrogen barrier films, and therefore it is difficult to say that resistance to hydrogen diffusion is sufficient. Then, if the hydrogen barrier film is simply added to this art, there arises a new problem such as an increase of variation.

Patent Document 2 discloses an art in which after an opening reaching a top electrode is formed, an opening reaching a semiconductor substrate is formed. However, in this art, in forming the opening reaching the semiconductor substrate, significant damage is caused to a ferroelectric capacitor via the top electrode.

Patent Document 1: Japanese Laid-open Patent Publication No. 2002-9256

Patent Document 2: Japanese Laid-open Patent Publication No. 2000-164827

Patent Document 3: Japanese Patent No. 3165093

SUMMARY OF THE INVENTION

An object of the present invention is to provide a manufacturing method of a semiconductor device capable of obtaining stable characteristics as increasing resistance of a ferroelectric capacitor to hydrogen diffusion.

In the manufacturing method of a semiconductor device according to the present invention, a ferroelectric capacitor is formed above a semiconductor substrate, and a first hydrogen barrier film directly covering the ferroelectric capacitor is formed. A first insulating film whose surface is flat is formed on the first hydrogen barrier film. A second hydrogen barrier film is formed immediately on the first insulating film. A second insulating film is formed on the second hydrogen barrier film. A first conductive plug securing conduction to the semiconductor substrate is formed in at least the second insulating film, the second hydrogen barrier film, and the first insulting film. An oxidation preventing film is formed on the first conductive plug and the second insulating film. A second conductive plug securing conduction to an electrode of the ferroelectric capacitor is formed in the oxidation preventing film, the second insulating film, the second hydrogen barrier film, the first insulating film, and the first hydrogen barrier film.

BRIEF DESCRIPTION OF THE DRAWINGS

FIG. 9A to FIG. 9M are cross-sectional views showing a conventional manufacturing method of a ferroelectric memory in order of steps;

FIG. 14 is a graph showing an increase rate of contact resistance.

DETAILED DESCRIPTION OF THE PREFERRED EMBODIMENTS

Hereinafter, embodiments of the present invention will be explained concretely with reference to the attached drawings. In these embodiments, a ferroelectric memory provided with a ferroelectric memory cell portion, a logic circuit portion, a peripheral circuit portion, and a pad portion is manufactured. However, in the following explanation, the ferroelectric memory cell portion will be mainly explained.

-First Embodiment-

Figure 1A:
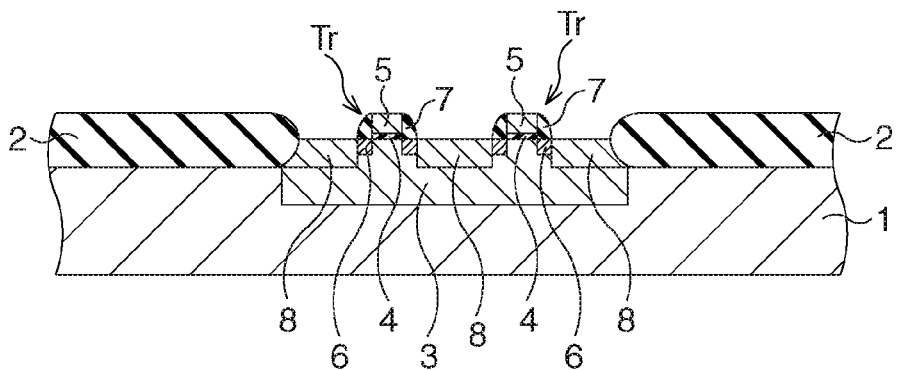
FIG. 1A to FIG. 1P are cross-sectional views showing a manufacturing method of a ferroelectric memory according to a first embodiment of the present invention in order of steps.

First, a first embodiment of the present invention will be explained. FIG. 1A to FIG. 1P are cross-sectional views showing a manufacturing method of a ferroelectric memory (a semiconductor device) according to the first embodiment of the present invention in order of steps.

In the first embodiment, as illustrated in FIG. 1A, an element isolation insulating film 2 is first formed on a surface of a semiconductor substrate 1 composed of silicon or the like. The element isolation insulating film 2 is formed by, for example, a LOCOS (local oxidation of silicon) method or an STI (shallow trench isolation) method. Next, an ion implantation of P-type impurity (for example, boron) is performed in the surface of an element region demarcated by the element isolation insulating film 2 thereby forming a P-well 3. Next, gate insulating films 4 and gate electrodes 5 are formed on the P-well 3. Thereafter, an ion implantation of N-type impurity (for example, phosphorus) is performed in the surface of the P-well 3 thereby forming shallow impurity diffusion layers 6. Subsequently, sidewall insulating films 7 are formed on lateral sides of the gate electrodes 5. Next, an ion implantation of N-type impurity (for example, arsenic) is performed in the surface of the P-well 3 thereby forming deep impurity diffusion layers 8. Thus, transistors Tr are formed. A channel length of the transistor Tr is not limited in particular, but it may be, for example, 360 μm. Further, the gate insulating film 4 may be a silicon oxide film whose thickness is, for example, 6 nm to 7 nm, and the gate electrode 5 may be constituted with, for example, an amorphous silicon layer whose thickness is approximately 50 nm and a tungsten silicide layer whose thickness is approximately 150 nm formed thereon. Note that the single transistor Tr includes the two impurity diffusion layers 8, and one of them is shared with another transistor Tr. The impurity diffusion layer 8 that is shared constitutes a drain, and the impurity diffusion layer 8 that is not shared constitutes a source.

Figure 1B:
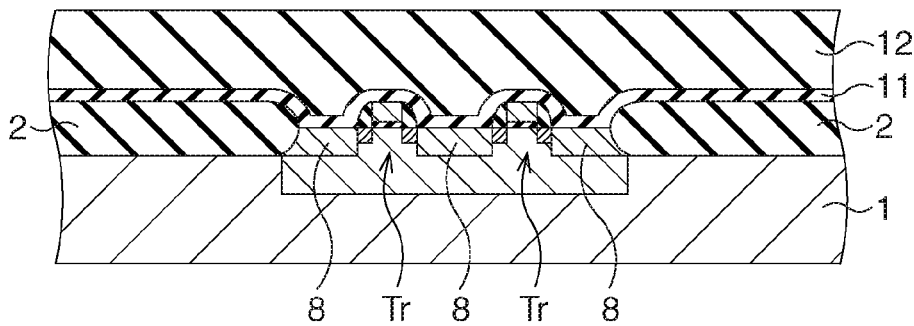

Next, as illustrated in FIG. 1B, a silicon oxynitride film 11 covering the transistors Tr is formed by a plasma CVD method or the like, and an NSG (non-doped silicate glass) film 12 is formed thereon by a plasma CVD method using TEOS or the like. The thickness of the silicon oxynitride film 11 may be set to be approximately 200 nm, and the thickness of the NSG film 12 may be set to be approximately 600 nm. Next, the surface of the NSG film 12 is polished for approximately 200 nm to be flattened. In the present embodiment, a third insulating film may include the silicon oxynitride film 11 and the NSG film 12.

Figure 1C:
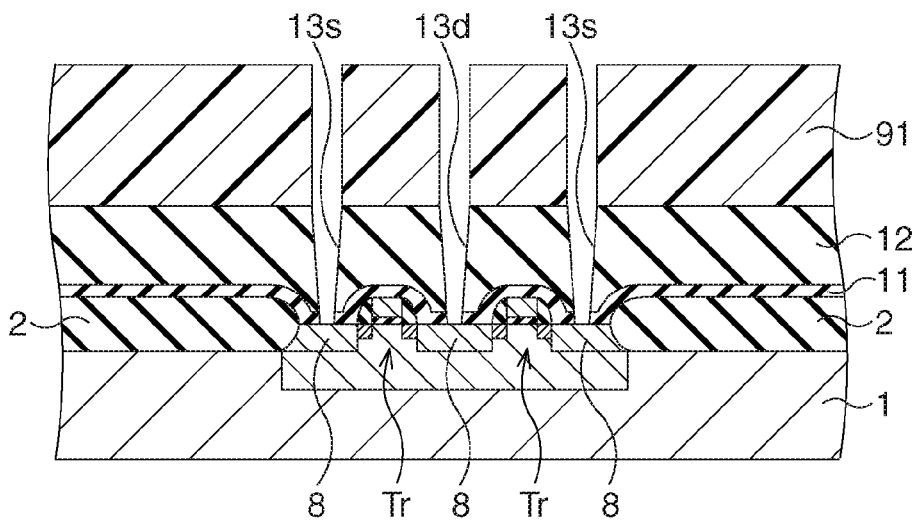

Thereafter, as illustrated in FIG. 1C, a resist pattern 91 having openings at positions matching with the impurity diffusion layers 8 is formed on the NSG film 12. Then, etching of the NSG film 12 and so on is performed with using the resist pattern 91 as a mask thereby forming contact holes 13s reaching the sources and a contact hole 13d reaching the drain.

Figure 1D:
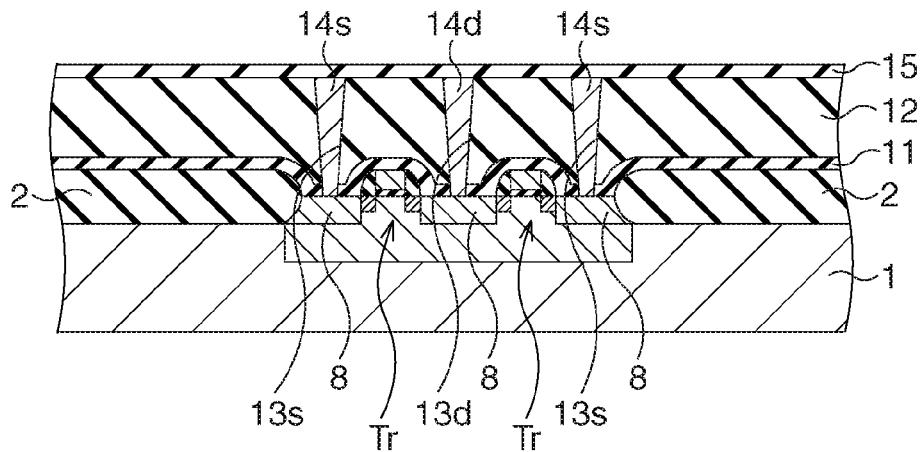

Subsequently, as illustrated in FIG. 1D, the resist pattern 91 is removed. Next, a barrier metal film (not-illustrated) whose thickness is approximately 70 nm is formed on the entire surface by, for example, a PVD method, and a tungsten film (not-illustrated) whose thickness is approximately 500 nm is formed thereon by, for example, a CVD method. In forming the barrier metal film, for example, a titanium film whose thickness is approximately 20 nm is formed, and then a titanium nitride film whose thickness is approximately 50 nm is formed. Then, the tungsten film and the barrier metal film are polished by, for example, a CMP method until the NSG film 12 is exposed. As a result, contact plugs 14s are formed in the contact holes 13s, and a contact plug 14d is formed in the contact hole 13d. Next, plasma annealing is performed in a nitrogen atmosphere with using a CVD apparatus or the like, and thereby the surface of the NSG film 12 is nitrided. Thereafter, a silicon oxynitride film 15 whose thickness is approximately 100 nm is formed on the NSG film 12 by a plasma CVD method or the like. The plasma annealing may be set such that, for example, the temperature of the semiconductor substrate 1 is 350° C. and the treatment time is for two minutes, and $N_2O$ plasma is generated. A third conductive plug includes the contact plugs 14s and 14d.

Figure 1E:
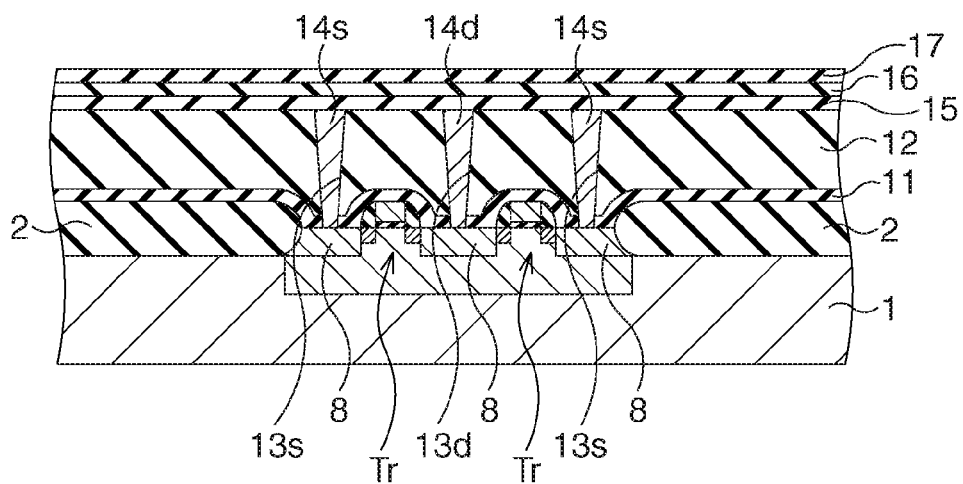

Subsequently, as illustrated in FIG. 1E, an NSG film 16 whose thickness is approximately 100 nm is formed on the silicon oxynitride film 15 by a plasma CVD method using TEOS or the like, and then a dehydration treatment thereof is performed. The dehydration treatment may be set such that, for example, the temperature of the semiconductor substrate 1 is 650° C., the treatment time is for 30 minutes, and the supply amount of nitrogen gas is 2 liters per minute. Next, an aluminum oxide film 17 whose thickness is approximately 20 nm is formed on the NSG film 16 by a PVD method or the like, and a heat treatment is performed. In the heat treatment, an RTA in which, for example, the temperature of the semiconductor substrate 1 is 650° C., the treatment time is for 60 seconds, and the supply amount of oxygen gas is 2 liters per minute is performed. In the present embodiment, a fourth oxide film includes the silicon oxynitride film 15, the NSG film 16, and the aluminum oxide film 17.

Figure 1F:
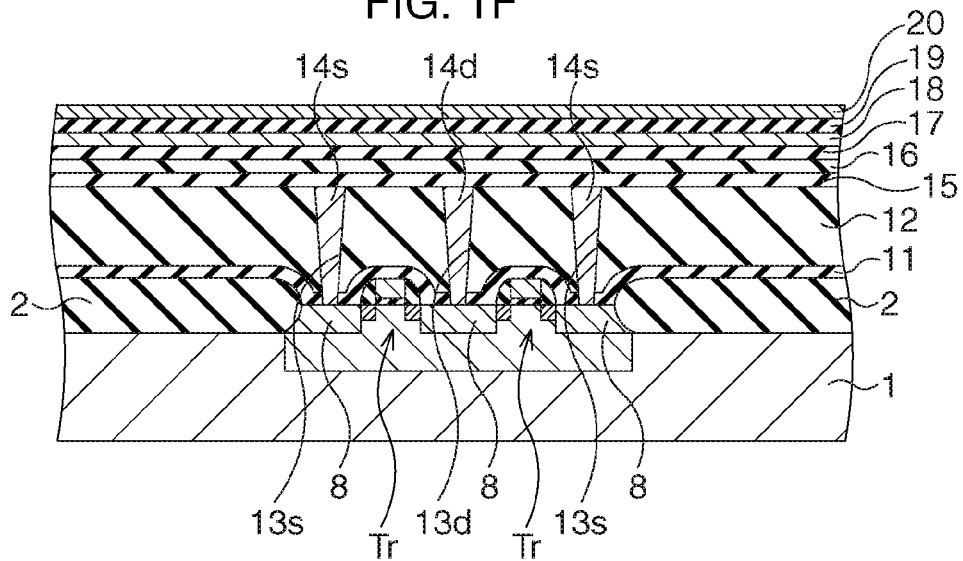

Subsequently, as illustrated in FIG. 1F, a platinum film 18, a PZT film 19, and an iridium oxide film 20 are formed sequentially on the aluminum oxide film 17 by a PVD method or the like. For example, the thickness of the platinum film 18 is set to be 155 nm, the thickness of the PZT film 19 is set to be approximately 150 nm to 200 nm, and the thickness of the iridium oxide film 20 is set to be 250 nm. A heat treatment is performed between forming the PZT film 19 and forming the iridium oxide film 20. In this heat treatment, an RTA in which the temperature of the semiconductor substrate 1 is 563° C., the treatment time is for 90 seconds, the supply amount of oxygen gas is 0.055 liters per minute, and the supply amount of argon gas is 1.95 liters per minute is performed. Further, the iridium oxide film 20 may have a two-layer structure, and a heat treatment is also performed after the lower layer (thickness: 50 nm) is formed. In this heat treatment, an RTA in which the temperature of the semiconductor substrate 1 is 708° C., the treatment time is for 20 seconds, the supply amount of oxygen gas is 0.02 liters per minute, and the supply amount of argon gas is 2.00 liters per minute is performed.

Figure 1G:
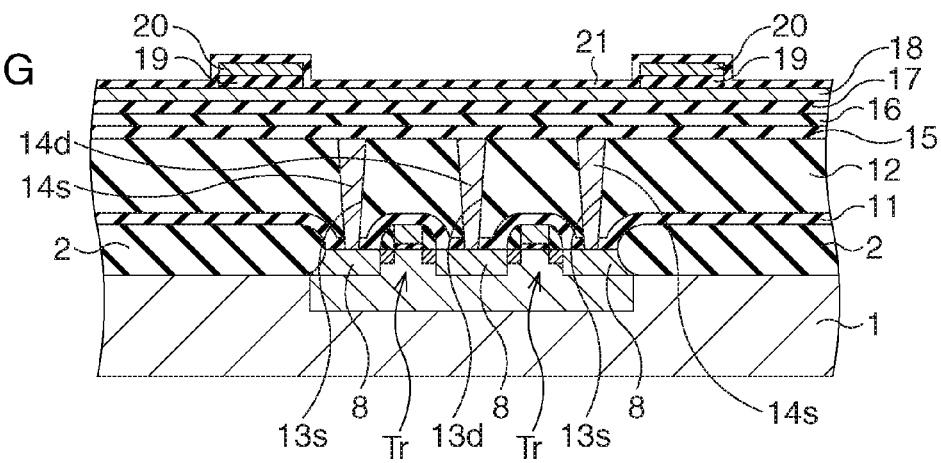

Thereafter, as illustrated in FIG. 1G, the iridium oxide film 20 is patterned, and then recovery annealing is performed. This recovery annealing may be set such that, for example, a vertical furnace is used, the temperature of the semiconductor substrate 1 is 650° C., the treatment time is for 60 minutes, and the supply amount of oxygen gas is 20 liters per minute. Subsequently, the PZT film 19 is patterned, and then recovery annealing is performed. This recovery annealing may be set such that, for example, a vertical furnace is used, the temperature of the semiconductor substrate 1 is 350° C., the treatment time is for 60 minutes, and the supply amount of oxygen gas is 20 liters per minute. Next, an aluminum oxide film 21 whose thickness is approximately 50 nm is formed on the entire surface by a PVD method or the like, and then recovery annealing is performed. This recovery annealing may be set such that, for example, a vertical furnace is used, the temperature of the semiconductor substrate 1 is 550° C., the treatment time is for 60 minutes, and the supply amount of oxygen gas is 20 liters per minute.

Figure 1H:
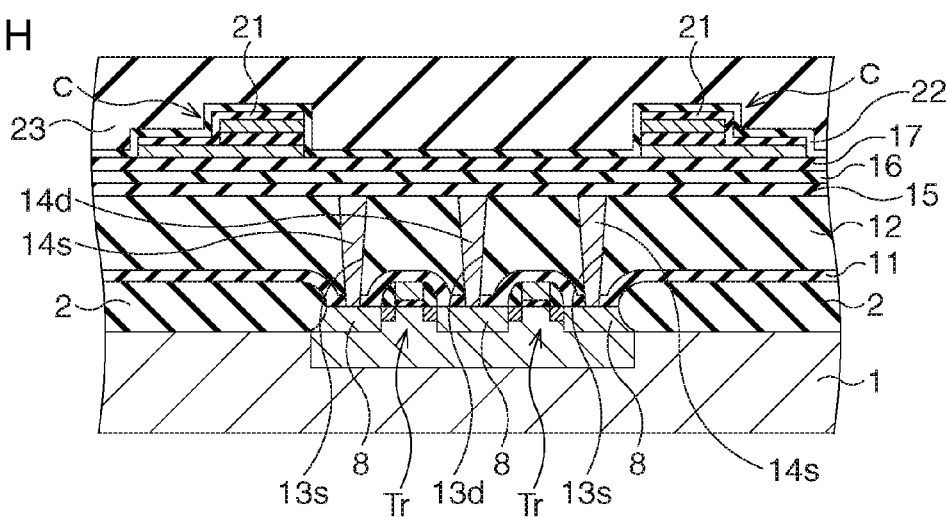

Subsequently, as illustrated in FIG. 1H, the aluminum oxide film 21 and the platinum film 18 are patterned. Thus, ferroelectric capacitors C are formed. Thereafter, recovery annealing is performed. This recovery annealing may be set such that, for example, a vertical furnace is used, the temperature of the semiconductor substrate 1 is 650° C., the treatment time is for 60 minutes, and the supply amount of oxygen gas is 20 liters per minute. Further, an aluminum oxide film 22 whose thickness is approximately 20 nm is formed on the entire surface by a PVD method or the like, and then recovery annealing is performed. This recovery annealing may be set such that, for example, a vertical furnace is used, the temperature of the semiconductor substrate 1 is 550° C., the treatment time is for 60 minutes, and the supply amount of oxygen gas is 20 liters per minute. Subsequently, an NSG film 23 whose thickness is approximately 1500 nm is formed on the aluminum oxide film 22 by a plasma CVD method using TEOS or the like, and the surface thereof is flattened. In the present embodiment, a first hydrogen barrier film includes the aluminum oxide films 21 and 22.

Figure 1I:
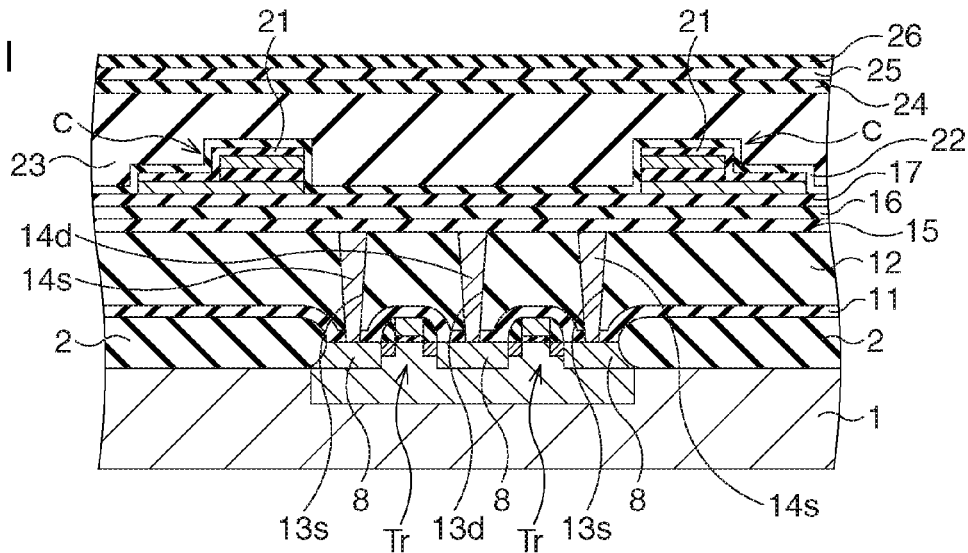

Next, plasma annealing is performed in a nitrogen atmosphere with using a CVD apparatus or the like, and thereby the surface of the NSG film 23 is nitrided. This plasma annealing may be set such that, for example, the temperature of the semiconductor substrate 1 is 350° C., the treatment time is for 2 minutes, and $N_2O$ plasma is generated. Next, as illustrated in FIG. 1I, an NSG film 24 whose thickness is approximately 100 nm is formed on the NSG film 23 by a plasma CVD method using TEOS or the like, and plasma annealing is performed in a nitrogen atmosphere with using a CVD apparatus or the like, and thereby the surface of the NSG film 24 is nitrided. This plasma annealing may be also set such that, for example, the temperature of the semiconductor substrate 1 is 350° C., the treatment time is for 2 minutes, and $N_2O$ plasma is generated. Thereafter, an aluminum oxide film 25 whose thickness is approximately 50 nm is formed on the entire surface by a PVD method or the like. Subsequently, an NSG film 26 whose thickness is approximately 100 nm is formed on the aluminum oxide film 25 by a plasma CVD method using TEOS or the like, and then plasma annealing is performed in a nitrogen atmosphere with using a CVD apparatus or the like, so that the surface of the NSG film 26 is nitrided. This plasma annealing may be also set such that, for example, the temperature of the semiconductor substrate 1 is 350° C., the treatment time is for 2 minutes, and $N_2O$ plasma is generated. In the present embodiment, a first insulating film includes the NSG films 23 and 24, and a second hydrogen barrier film includes the aluminum oxide film 25, and a second insulating film includes the NSG film 26.

Figure 1J:
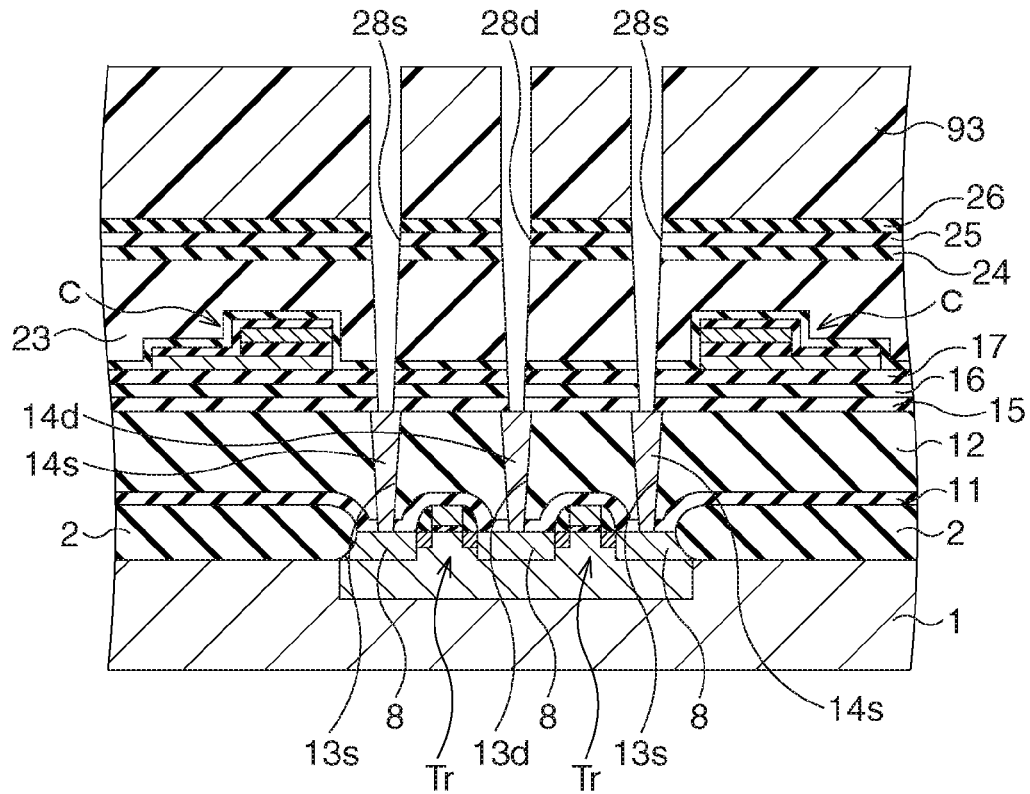

Next, as illustrated in FIG. 1J, a resist pattern 93 having openings at predetermined positions is formed on the NSG film 26. Then, etching of the NSG film 26 and so on is performed with using the resist pattern 93 as a mask thereby forming contact holes 28s reaching the contact plugs 14s and a contact hole 28d reaching the contact plug 14d.

Figure 1K:
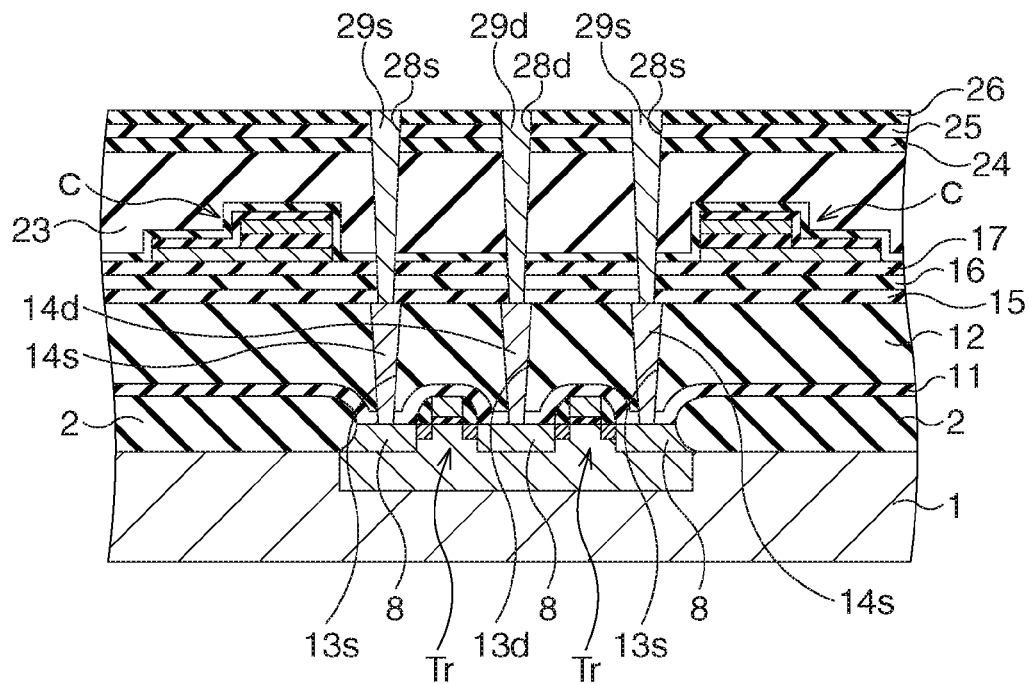

Next, as illustrated in FIG. 1K, the resist pattern 93 is removed. Thereafter, a barrier metal film (not-illustrated) whose thickness is approximately 70 nm is formed on the entire surface by, for example, a PVD method, and a tungsten film (not-illustrated) whose thickness is approximately 500 nm is formed thereon by, for example, a CVD method. In forming the barrier metal film, for example, a titanium film whose thickness is approximately 20 nm is formed, and then a titanium nitride film whose thickness is approximately 50 nm is formed. Then, the tungsten film and the barrier metal film are polished by, for example, a CMP method until the NSG film 26 is exposed. As a result, contact plugs 29s are formed in the contact holes 28s, and a contact plug 29d is formed in the contact hole 28d. Next, plasma annealing is performed in a nitrogen atmosphere with using a CVD apparatus or the like, and thereby the surface of the NSG film 26 is nitrided. This plasma annealing may be set such that, for example, the temperature of the semiconductor substrate 1 is 350° C., the treatment time is for 2 minutes, and $N_2O$ plasma is generated. In this embodiment, a first conductive plug includes the contact plugs 29s and 29d.

Figure 1L:
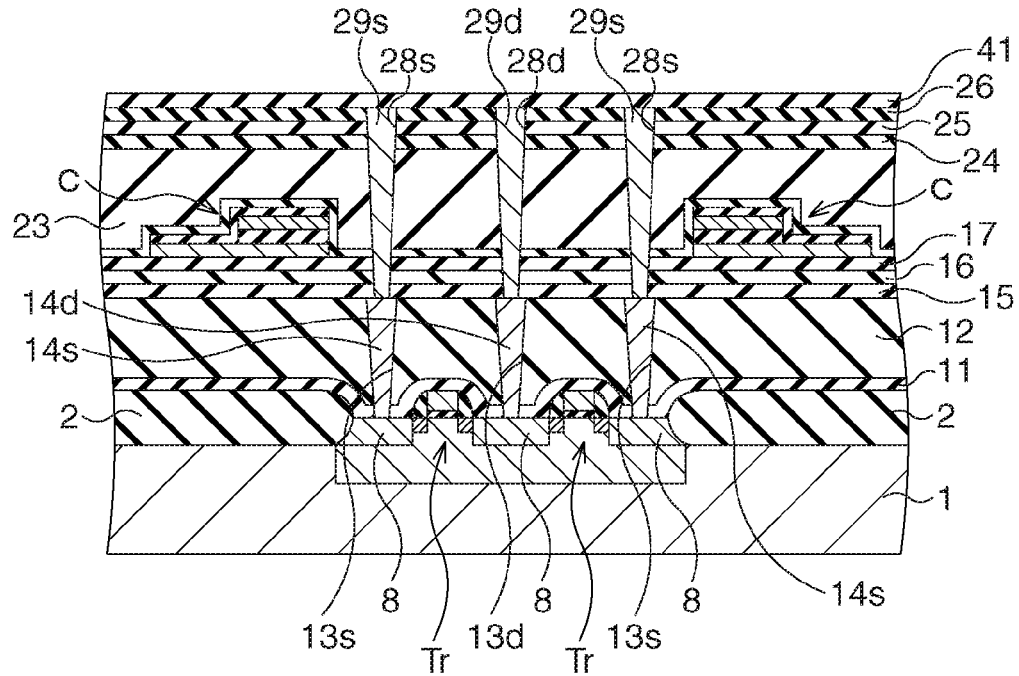

Subsequently, as illustrated in FIG. 1L, an aluminum oxide film 41 whose thickness is approximately 20 nm is formed on the entire surface by a PVD method or the like as an oxidation preventing film for the contact plugs 29s and 29d. Note that in place of the aluminum oxide film 41, a metal oxide film such as a titanium oxide film, a zirconium oxide film, a magnesium oxide film, or a magnesium titanium oxide film may be used. It is preferable that the thickness of these (including the aluminum oxide film 41) is 20 nm to 50 nm. If the thickness exceeds 50 nm, there is a possibility that subsequent processes will be difficult to be performed.

Figure 1M:
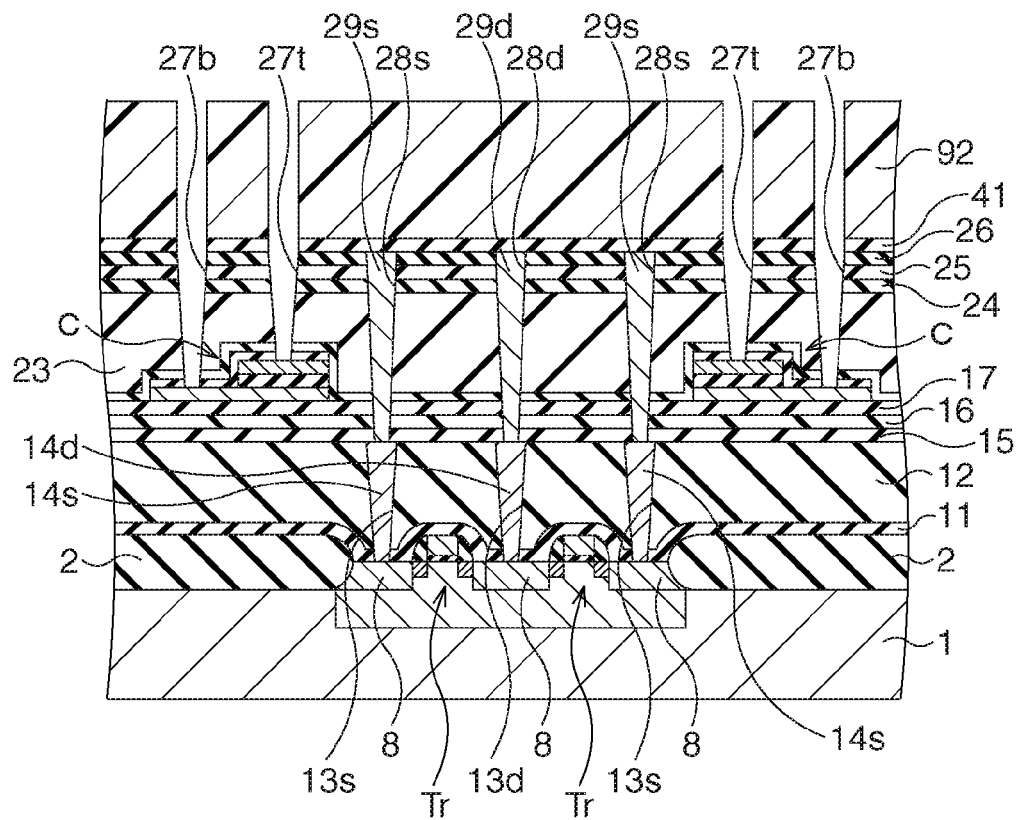

Next, as illustrated in FIG. 1M, a resist pattern 92 having openings at predetermined positions is formed on the aluminum oxide film 41. Then, etching of the aluminum oxide film 41 and so on is performed with using the resist pattern 92 as a mask thereby forming contact holes 27t reaching top electrodes (the iridium oxide film 20) and contact holes 27b reaching bottom electrodes (the platinum film 18).

Figure 1N:
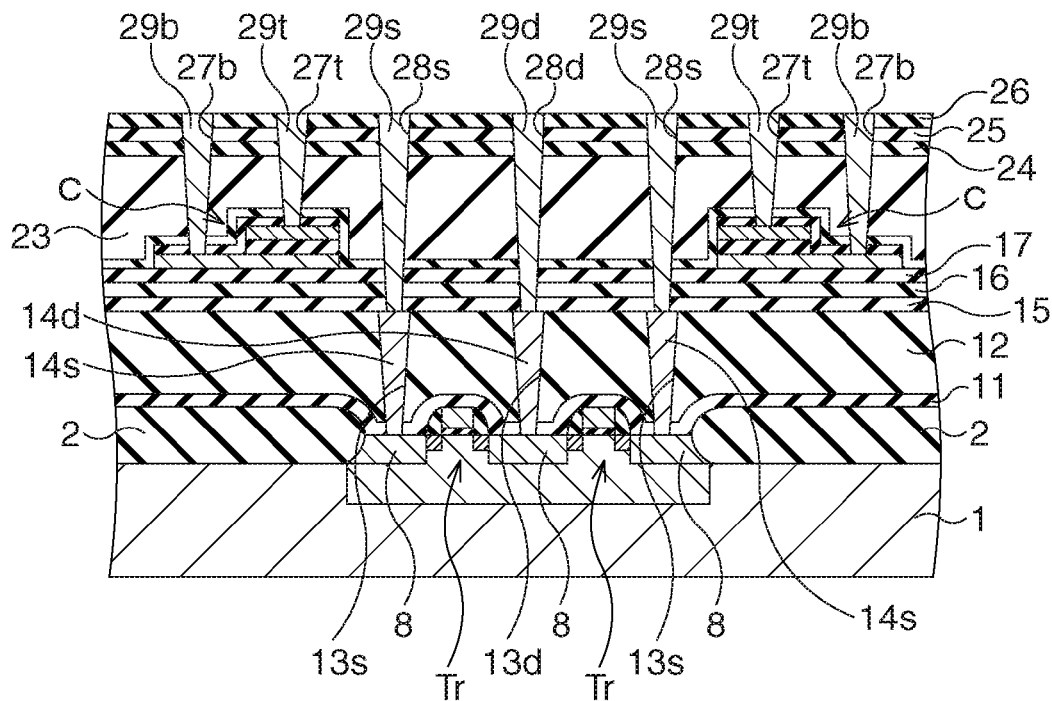

Next, as illustrated in FIG. 1N, the resist pattern 92 is removed, and then recovery annealing is performed. This recovery annealing may be set such that, for example, a vertical furnace is used, the temperature of the semiconductor substrate 1 is 500° C., the treatment time is for 60 minutes, and the supply amount of oxygen gas is 20 liters per minute. Thereafter, a barrier metal film (not-illustrated) whose thickness is approximately 70 nm is formed on the entire surface by, for example, a PVD method, and a tungsten film (not-illustrated) whose thickness is approximately 500 nm is formed thereon by, for example, a CVD method. In forming the barrier metal film, for example, a titanium film whose thickness is approximately 20 nm is formed, and then a titanium nitride film whose thickness is approximately 50 nm is formed. Then, the tungsten film and the barrier metal film are polished by, for example, a CMP method until the NSG film 26 is exposed. As a result, contact plugs 29t are formed in the contact holes 27t, and contact plugs 29b are formed in the contact holes 27b. Next, plasma annealing is performed in a nitrogen atmosphere with using a CVD apparatus or the like, and thereby the surface of the NSG film 26 is nitrided. This plasma annealing may be also set such that, for example, the temperature of the semiconductor substrate 1 is 350° C., the treatment time is for 2 minutes, and $N_2O$ plasma is generated. In the present embodiment, a second conductive plug includes the contact plugs 29t and 29b.

Figure 1O:
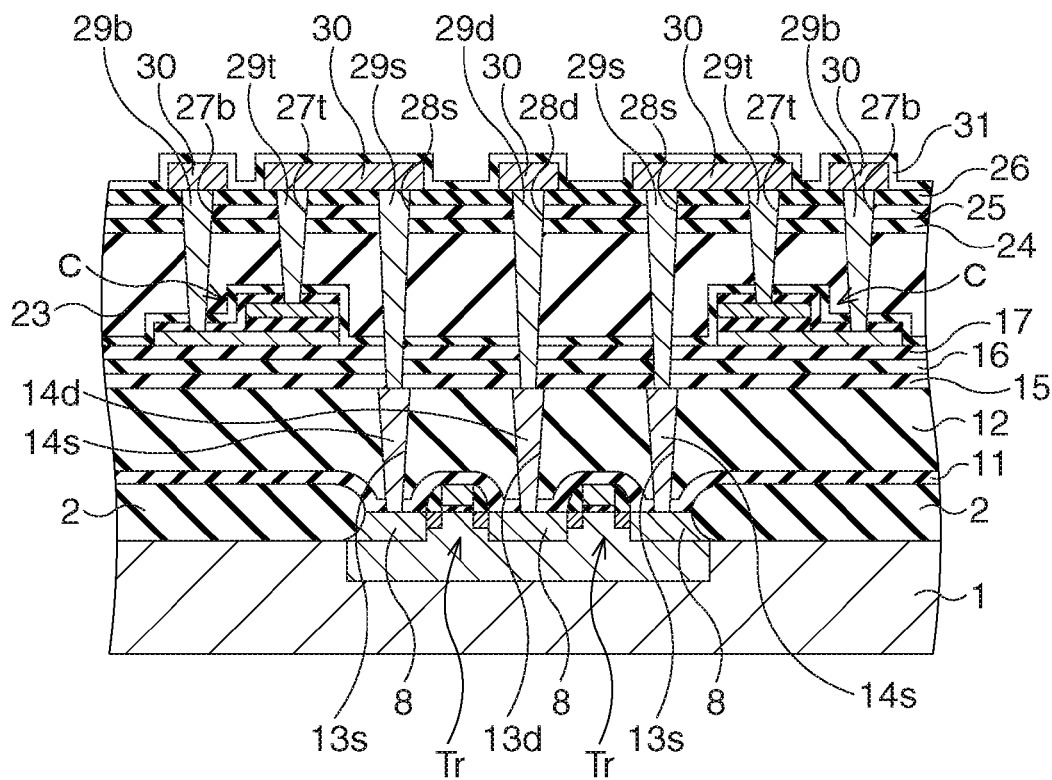

Next, as illustrated in FIG. 1O, wirings 30 in contact with the contact plugs 29t, 29b, 29s, and 29d are formed. The wirings 30 connect, for example, the contact plug 28s and the contact plug 29t electrically. Note that in forming the wirings 30, firstly a titanium nitride film whose thickness is approximately 150 nm, an AlCu alloy film whose thickness is approximately 550 nm, a titanium film whose thickness is approximately 5 nm, and a titanium nitride film whose thickness is approximately 150 nm are sequentially formed by a PVD method or the like. Next, patterning of these films is performed.

After the wirings 30 are formed, a heat treatment in which a vertical furnace is used, the temperature of the semiconductor substrate 1 is 350° C., the treatment time is for 30 minutes, and the supply amount of nitrogen gas is 20 liters per minute is performed. Next, as illustrated in FIG. 1O, an aluminum oxide film 31 whose thickness is approximately 20 nm is formed on the entire surface by a PVD method or the like.

Thereafter, as illustrated in FIG. 1P, upper layer wirings and so on are formed. Although illustration in FIG. 1A to FIG. 1O is omitted, forming the transistor, the wirings, and so on is performed not only in a ferroelectric memory cell portion 81, but also in a logic circuit portion 82, a peripheral circuit portion 83, and a pad portion 84.

Figure 2A:
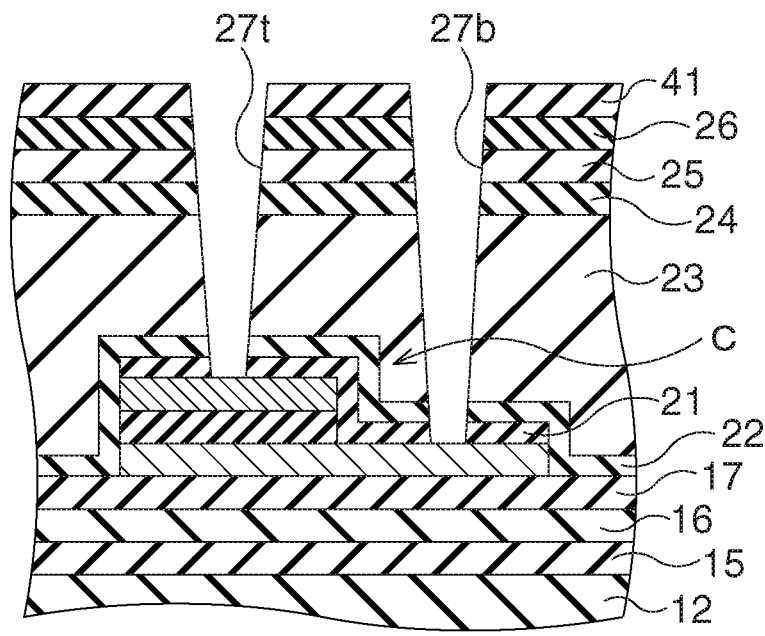
FIG. 2A is a cross-sectional view showing a state after a resist pattern 92 is removed in the first embodiment.
Figure 2B:
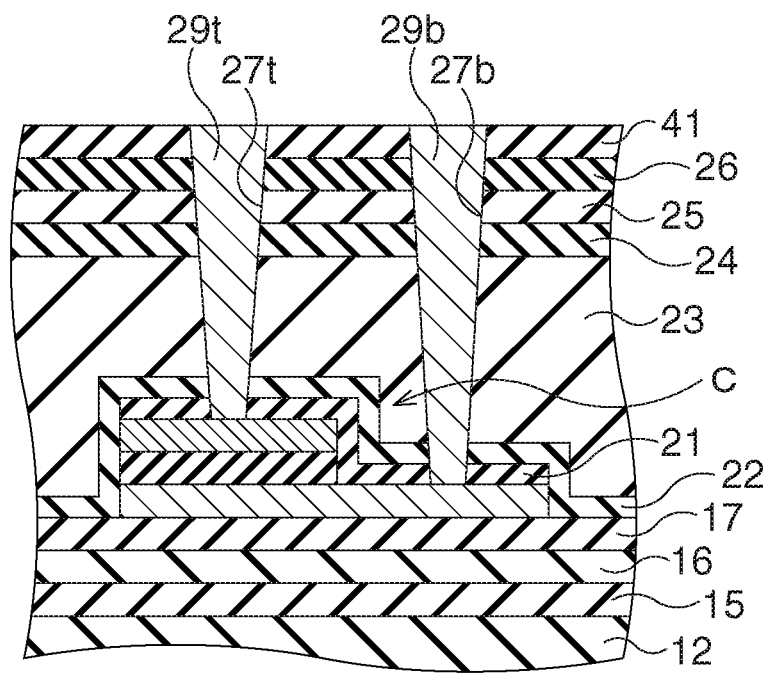
FIG. 2B is a cross-sectional view showing a state after contact plugs 29t and 29b are formed in the first embodiment.

In the first embodiment, there is no case that the resist pattern gets into the contact hole, and therefore, a contact failure between the contact plugs and the top electrode, the bottom electrode and the like due to presence of a substance deteriorated from the resist pattern is not caused. For example, after the resist pattern 92 is removed, as illustrated in FIG. 2A, the substances causing the contact failure do not exist in the contact holes 27t and 27b. Consequently, as illustrated in FIG. 2B, the connection between the contact plugs 29t and 29b and the top electrode and the bottom electrode becomes good.

Further, a step where plasma damage is caused to the ferroelectric capacitor C is not included. Further, a film whose etching rate is lower than that of the silicon oxide film such as the NSG film is not so necessary as a problem is caused to the shape of the contact hole or variation occurs. Further, the aluminum oxide film 25 is formed as a hydrogen diffusion preventing film between the ferroelectric capacitor C and the wirings 30, which are the closest to the substrate, and therefore, oxygen deficiency in the PZT film 19 is not caused easily. Thus, according to the first embodiment, the ferroelectric memory whose characteristics are stable can be obtained.

-Second Embodiment-

Figure 3A:
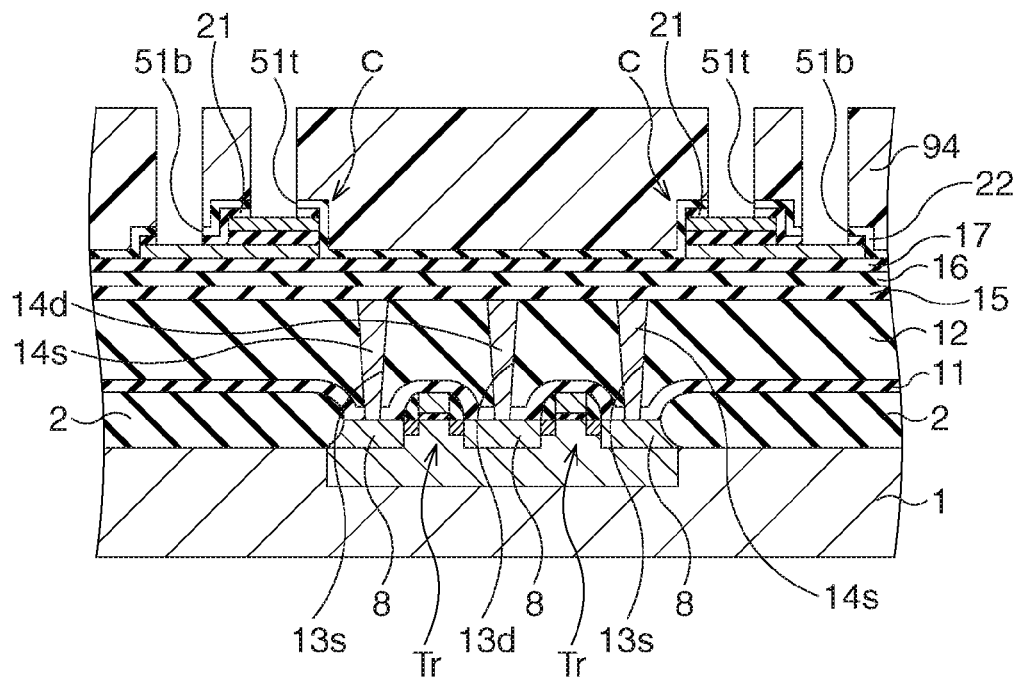
FIG. 3A to FIG. 3C are cross-sectional views showing a manufacturing method of a ferroelectric memory according to a second embodiment of the present invention in order of steps.
Figure 3B:
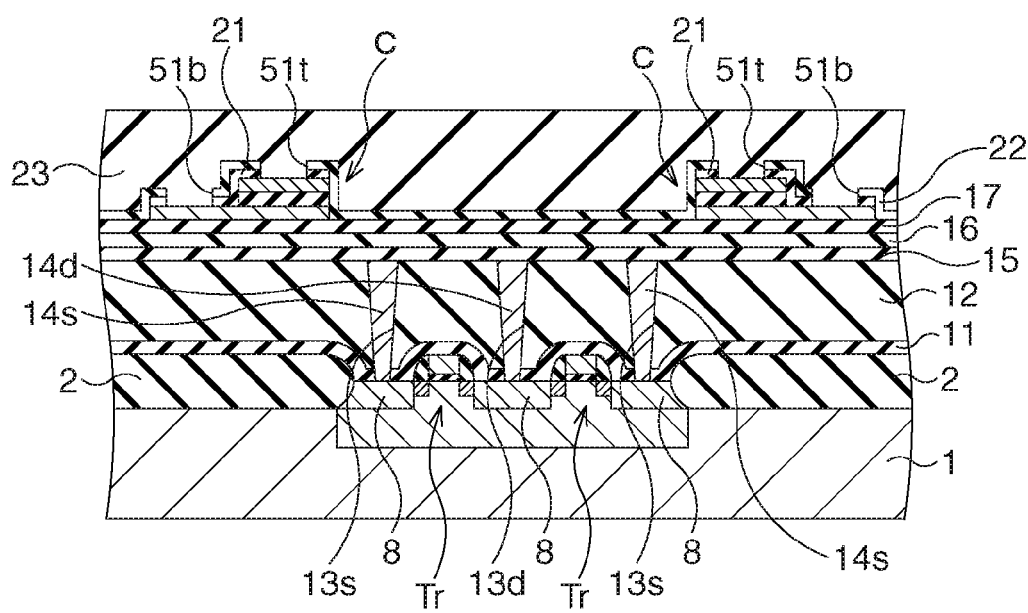
Figure 3C:
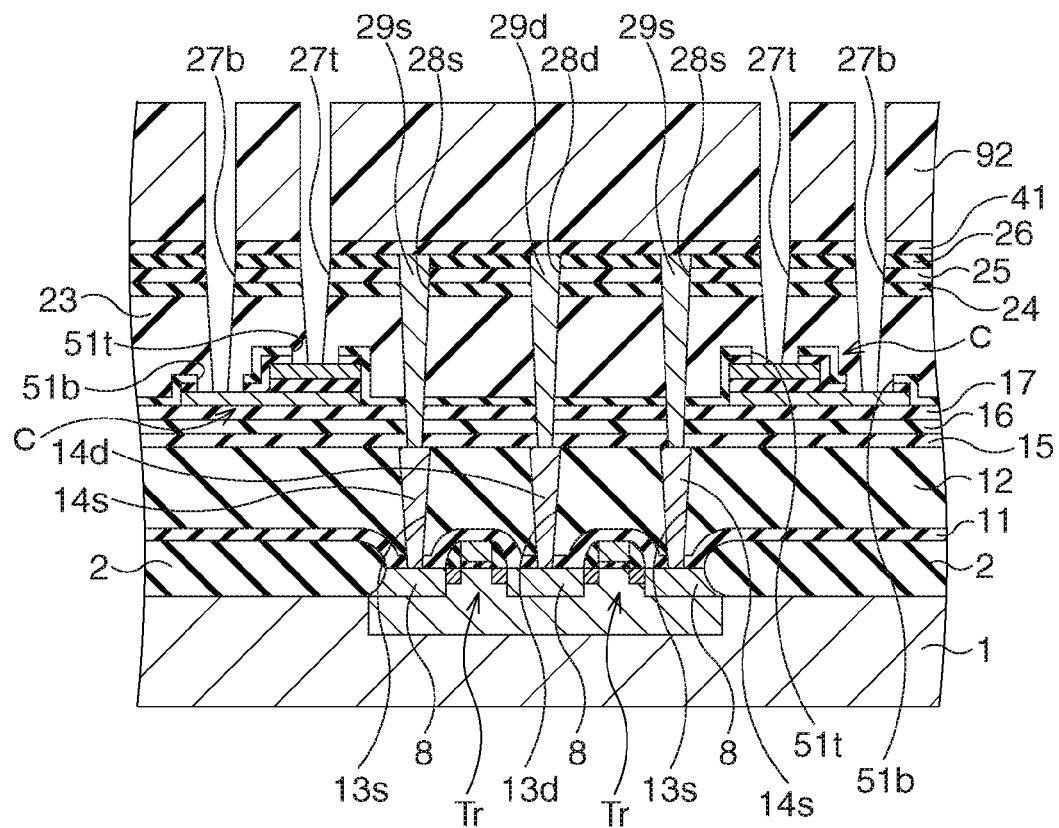

Next, a second embodiment of the present invention will be explained. FIG. 3A to FIG. 3C are cross-sectional views showing a manufacturing method of a ferroelectric memory according to the second embodiment of the present invention in order of steps.

In the second embodiment, first, similarly to the first embodiment, the processes to the formation of the aluminum oxide film 22 and the recovery annealing that is performed immediately thereafter are performed (refer to FIG. 1H). Next, as illustrated in FIG. 3A, a resist pattern 94 having openings at predetermined positions is formed. At this time, the openings in the resist pattern 94 are set to be larger than the openings in the resist pattern 92. Then, etching of the aluminum oxide films 22 and 21 is performed with using the resist pattern 94 as a mask thereby forming openings 51t where portions of the top electrodes (the iridium oxide film 20) are exposed and openings 51b where portions of the bottom electrodes (the platinum film 18) are exposed. The opening 51t is wider than the contact hole 27t, and the opening 51b is wider than the contact hole 27b.

Next, as illustrated in FIG. 3B, the resist pattern 94 is removed, and the NSG film 23 whose thickness is approximately 1500 nm is formed on the aluminum oxide film 22 by a plasma CVD method using TEOS or the like, and the surface thereof is flattened.

Thereafter, as illustrated in FIG. 3C, similarly to the first embodiment, the processes from nitriding the surface of the NSG film 23 to forming the resist pattern 92 are performed. Subsequently, etching of the NSG film 26 and so on is performed with using the resist pattern 92 as a mask thereby forming the contact holes 27t and 27b. At this time, in the present embodiment, the openings 51t and 51b are formed in the aluminum oxide films 21 and 22, and thereby, the aluminum oxide films 21 and 22 are not required to be processed. Therefore, it becomes possible to form the contact holes 27t and 27b more easily than the first embodiment. Consequently, a problem in the shape of the contact hole is not caused, and further, variation does not occur rather than the first embodiment.

Thereafter, similarly to the first embodiment, the processes from the removal of the resist pattern 92 are performed.

Figure 4:
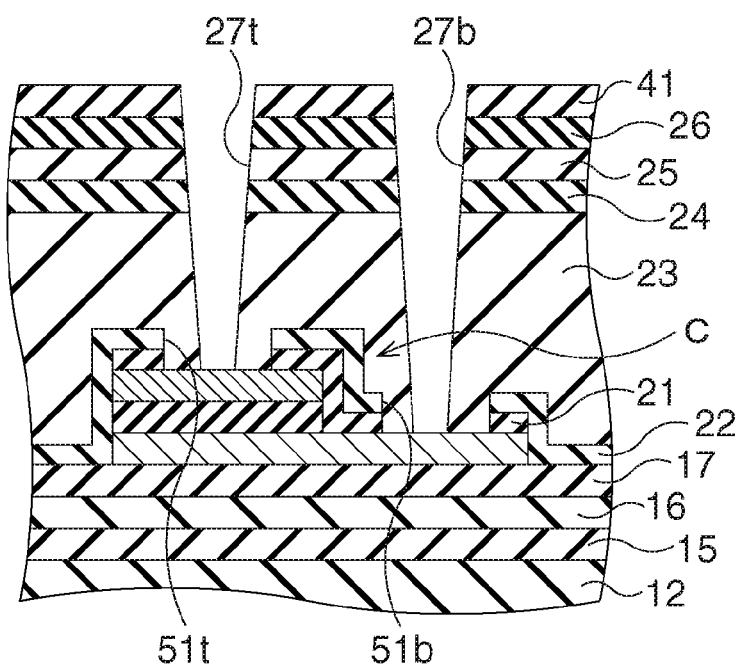
FIG. 4 is a cross-sectional view showing a state after a resist pattern 92 is removed in the second embodiment.

In the second embodiment, as illustrated in FIG. 4, the films required to be processed in forming the contact holes 27t and 27b are the aluminum oxide film 41, the NSG film 26, the aluminum oxide film 25, and the NSG films 24 and 23, resulting that the number of films is smaller than that of the first embodiment. Consequently, as described above, etching is performed more easily than the first embodiment, and the ferroelectric capacitor whose characteristics are further stable can be obtained.

-Third Embodiment-

Next, a third embodiment of the present invention will be explained. FIG. 5A to FIG. 5D are cross-sectional views showing a manufacturing method of a ferroelectric memory according to the third embodiment of the present invention in order of steps.

Figure 5A:
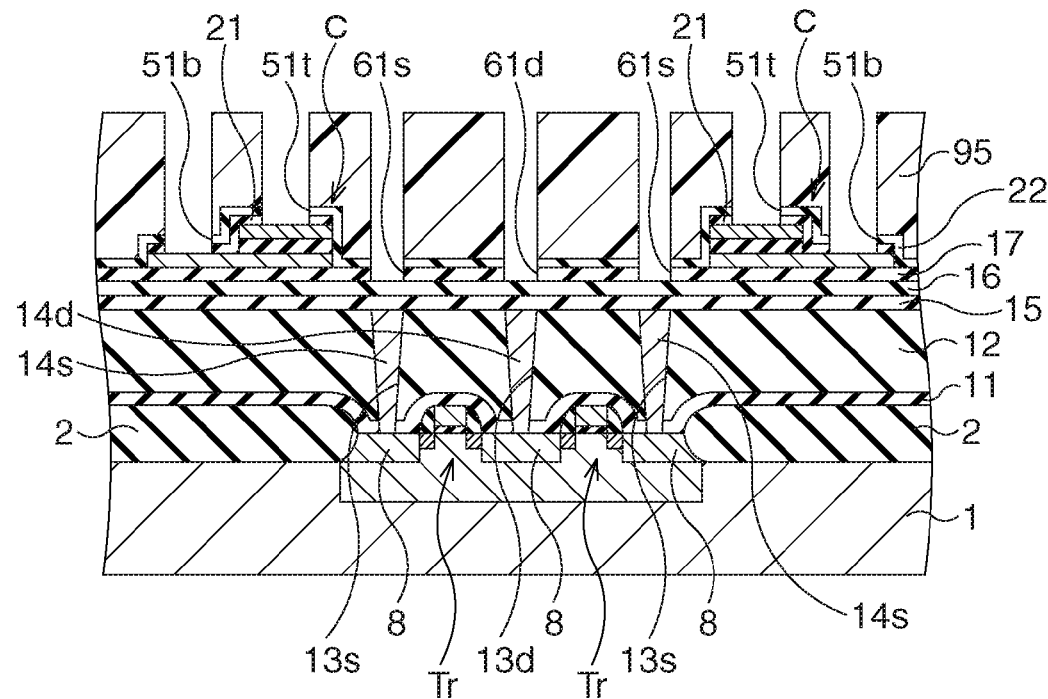
FIG. 5A to FIG. 5D are cross-sectional views showing a manufacturing method of a ferroelectric memory according to a third embodiment of the present invention in order of steps.

In the third embodiment, first, similarly to the first embodiment, the processes to the formation of the aluminum oxide film 22 and the recovery annealing that is performed immediately thereafter are performed (refer to FIG. 1H). Next, as illustrated in FIG. 5A, a resist pattern 95 having openings at predetermined positions is formed. At this time, some of the openings in the resist pattern 95 are set to be larger than the openings in the resist pattern 92. Further the others of the openings in the resist pattern 95 are the same as the openings in the resist pattern 93. Then, etching of the aluminum oxide films 22 and 21 is performed with using the resist pattern 95 as a mask thereby forming openings 61s positioned above the contact plugs 14s and an opening 61d positioned above the contact plug 14d together with the openings 51t and 51b.

Figure 5B:
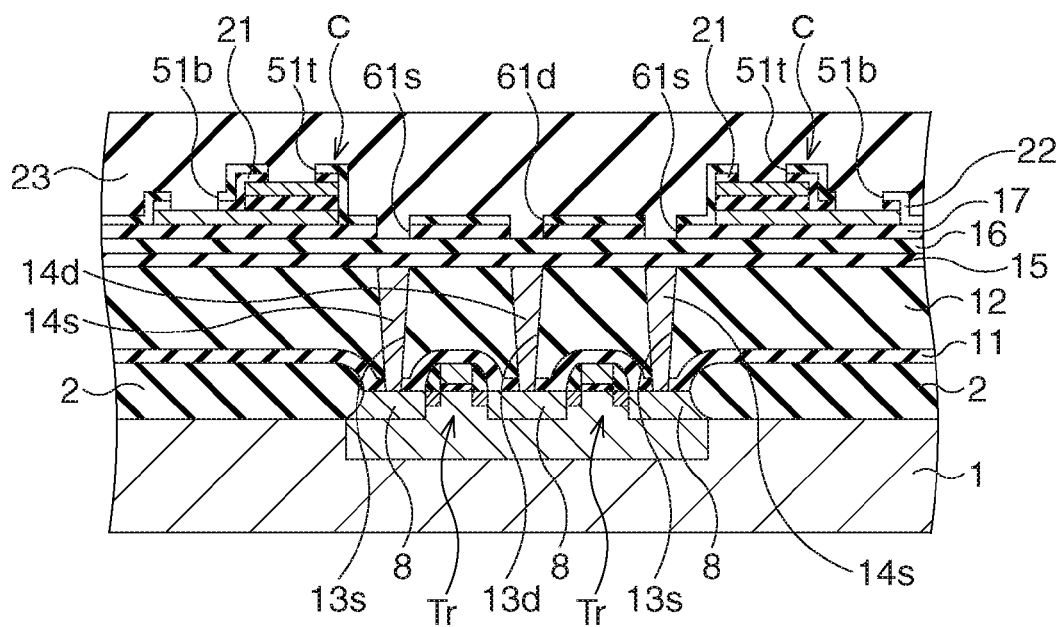

Next, as illustrated in FIG. 5B, the resist pattern 95 is removed, and the NSG film 23 whose thickness is approximately 1500 nm is formed on the aluminum oxide film 22 by a plasma CVD method using TEOS or the like, and the surface thereof is flattened.

Figure 5C:
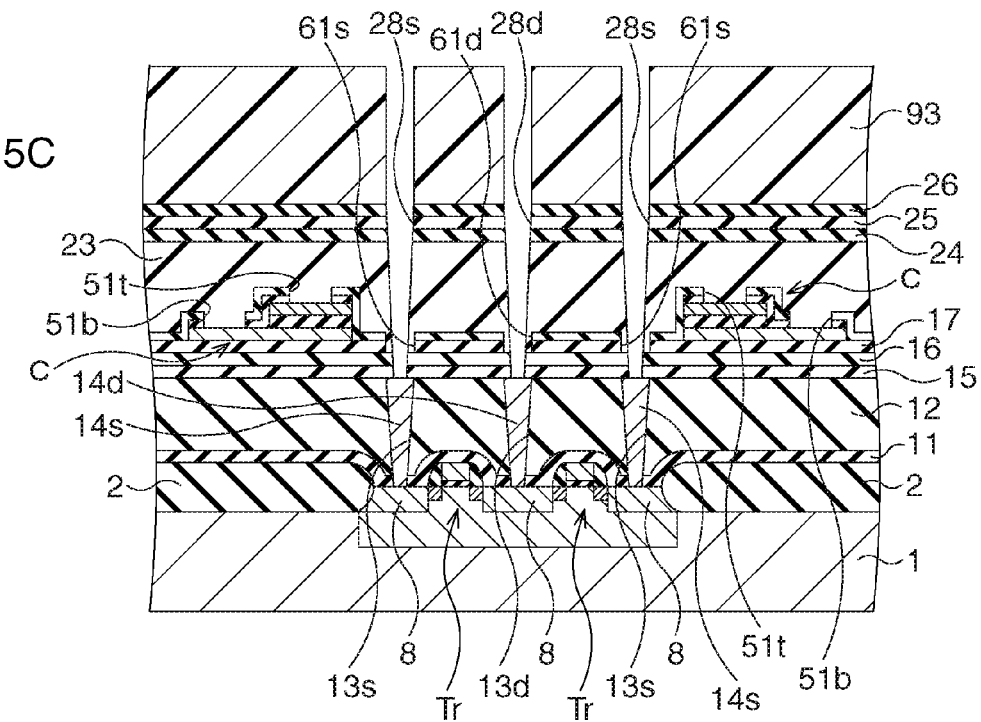

Next, as illustrated in FIG. 5C, similarly to the first embodiment, the processes from nitriding the surface of the NSG film 23 to forming the resist pattern 93 are performed. Then, etching of the NSG film 26 and so on is performed with using the resist pattern 93 as a mask thereby forming the contact holes 28s and 28d. At this time, in the present embodiment, the openings 61s and 61d are formed in the aluminum oxide films 21 and 22, and thereby, the aluminum oxide films 21 and 22 are not required to be processed. Therefore, it becomes possible to form the contact holes 28s and 28d more easily than the first embodiment. Consequently, a problem in the shape of the contact hole is not caused, and further, variation does not occur rather than the first embodiment. Note that in FIG. 5C, the contact holes 28s and 28d are positioned inside the openings 61s and 61d, and this is because the opening and the contact hole have a tendency to be narrower as the positions of these are deeper.

Figure 5D:
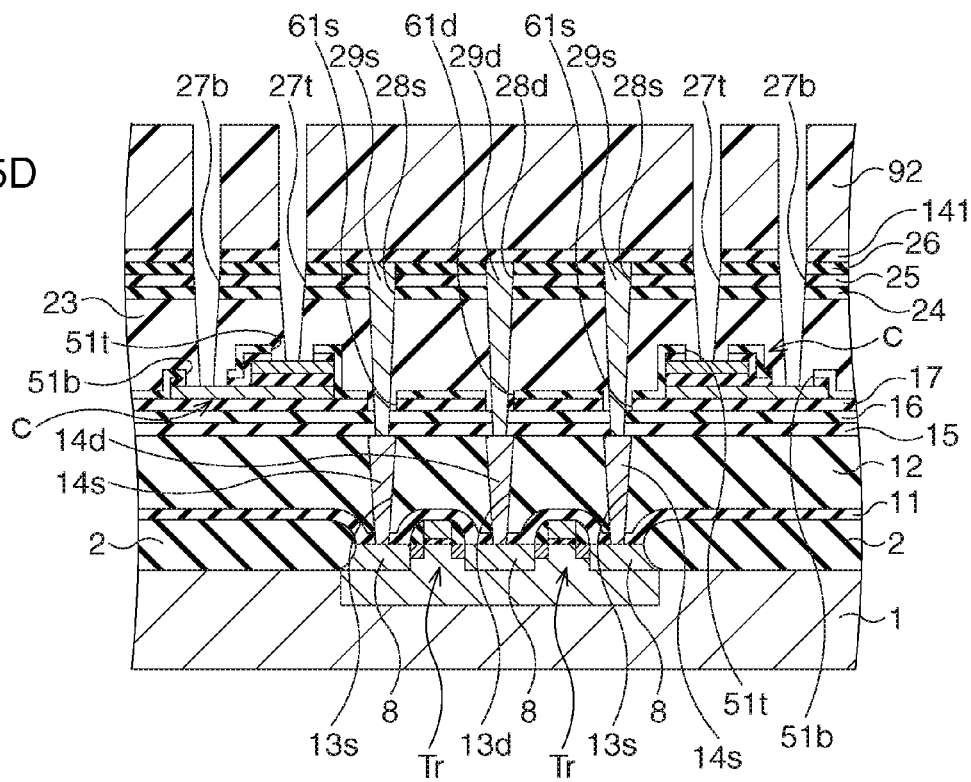

Subsequently, as illustrated in FIG. 5D, similarly to the first embodiment, the processes from removing the resist pattern 93 to forming the resist pattern 92 are performed. Subsequently, etching of the NSG film 26 and so on is performed with using the resist pattern 92 as a mask thereby forming the contact holes 27t and 27b. At this time, similarly to the second embodiment, the aluminum oxide films 21 and 22 are not required to be processed, and therefore, it becomes possible to form the contact holes 27t and 27b more easily than the first embodiment.

Thereafter, similarly to the first embodiment, the processes from the removal of the resist pattern 92 are performed.

According to the third embodiment, as described above, etching for forming the contact holes 28s and 28d becomes easier, and the ferroelectric capacitor whose characteristics are further stable can be obtained.

-Fourth Embodiment-

Figure 6A:
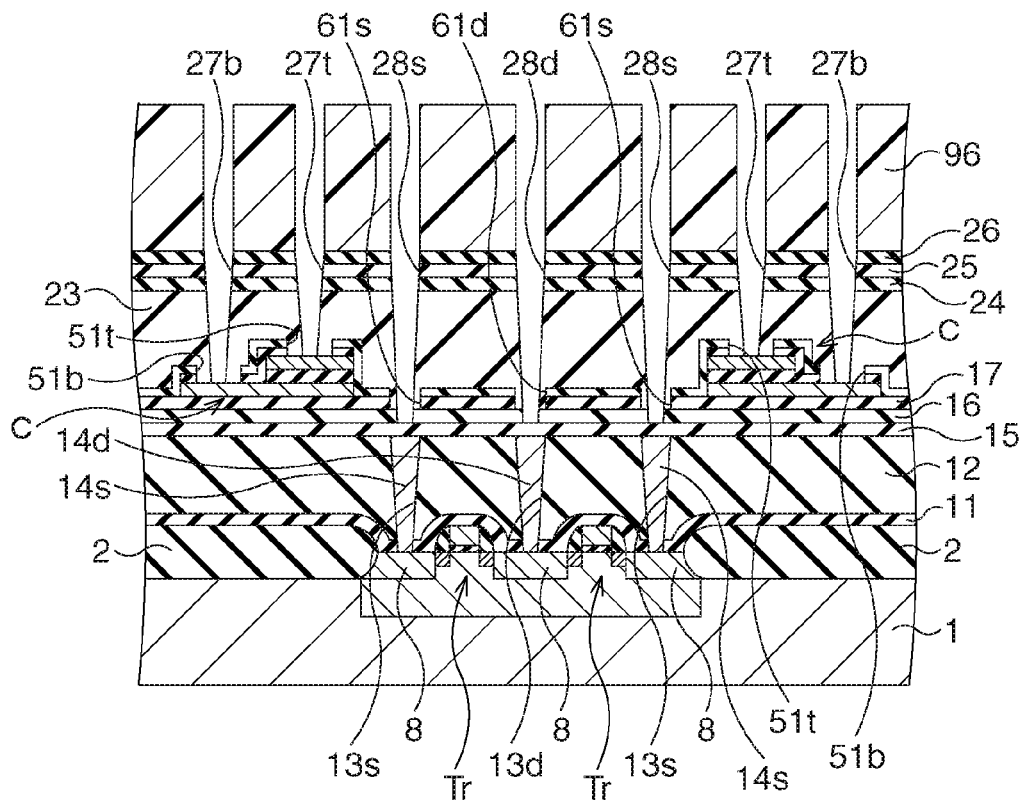
FIG. 6A and FIG. 6B are cross-sectional views showing a manufacturing method of a ferroelectric memory according to a fourth embodiment of the present invention in order of steps.
Figure 6B:
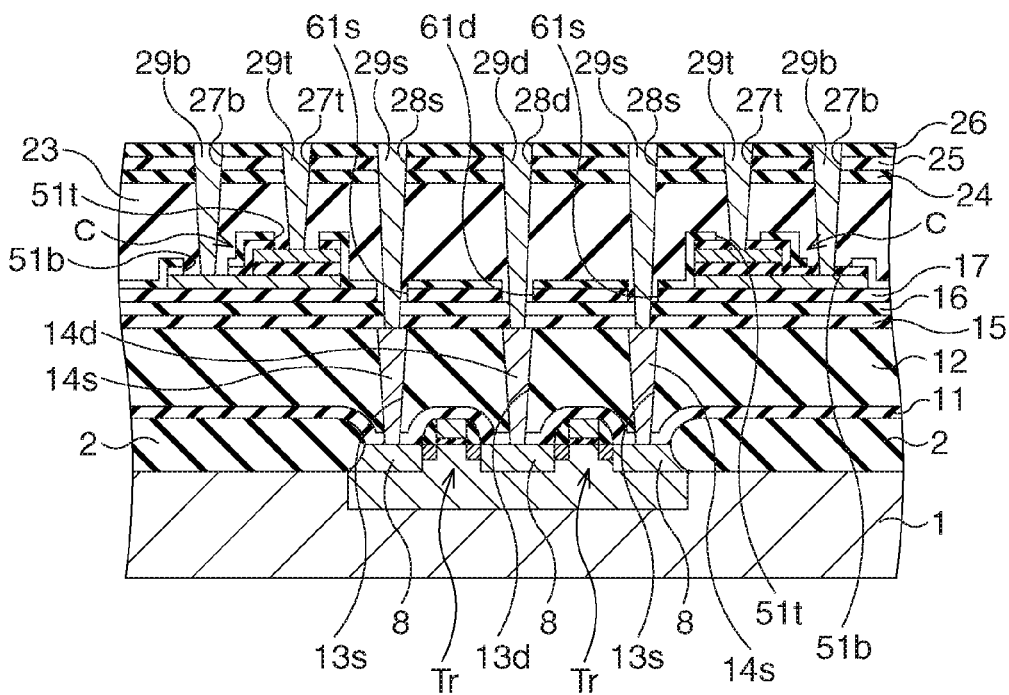

Next, a fourth embodiment of the present invention will be explained. FIG. 6A and FIG. 6B are cross-sectional views showing a manufacturing method of a ferroelectric memory according to the fourth embodiment of the present invention in order of steps.

In the fourth embodiment, first, similarly to the third embodiment, the processes to the formation of the NSG film 26 and the recovery annealing that is performed immediately thereafter are performed (refer to FIG. 5C). Next, in place of the resist pattern 93, as illustrated in FIG. 6A, a resist pattern 96 having openings at predetermined positions is formed. Some of the openings in the resist pattern 96 are set to be the same as the openings in the resist pattern 92, and the others of the openings are set to be the same as the openings in the resist pattern 93. Then, etching of the NSG film 26 and so on is performed with using the resist pattern 96 as a mask thereby forming the contact holes 27t, 27b, 28s, and 28d. Forming the contact holes 28s and 28d is stopped on the surface of the silicon oxynitride film 15.

Next, as illustrated in FIG. 6B, the resist pattern 96 is removed, and recovery annealing is performed. This recovery annealing may be set such that, for example, a vertical furnace is used, the temperature of the semiconductor substrate 1 is 500° C., the treatment time is for 60 minutes, and the supply amount of oxygen gas is 20 liters per minute. At this time, the contact plugs 14s and 14d are covered by the silicon oxynitride film 15, and therefore, there is no case that the contact plugs 14s and 14d are oxidized.

Thereafter, the contact holes 28s and 28d are made to reach the contact plugs 14s and 14d. Subsequently, a barrier metal film (not-illustrated) whose thickness is approximately 70 nm is formed on the entire surface by, for example, a PVD method, and a tungsten film (not-illustrated) whose thickness is approximately 500 nm is formed thereon by, for example, a CVD method. Then, the tungsten film and the barrier metal film are polished by, for example, a CMP method until the NSG film 26 is exposed. As a result, the contact plugs 29s 29d, 29t, and 29b are formed simultaneously.

Thereafter, similarly to the first embodiment, the processes from nitriding the surface of the NSG film 26 and forming the wirings 30 are performed.

According to the fourth embodiment, the number of times of patterning performed with using the resist pattern can be decreased rather than the third embodiment.

-Fifth Embodiment-

Next, a fifth embodiment of the present invention will be explained. FIG. 7A to FIG. 7D are cross-sectional views showing a manufacturing method of a ferroelectric memory according to the fifth embodiment of the present invention in order of steps.

Figure 7A:
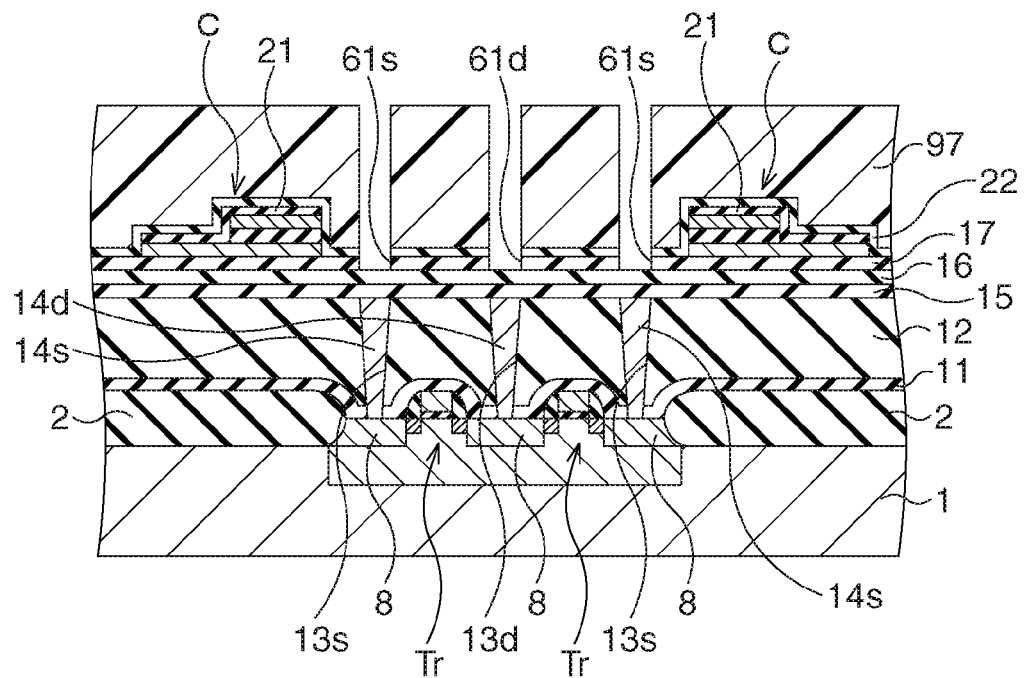
FIG. 7A to FIG. 7D are cross-sectional views showing a manufacturing method of a ferroelectric memory according to a fifth embodiment of the present invention in order of steps.

In the fifth embodiment, first, similarly to the first embodiment, the processes to the formation of the aluminum oxide film 22 and the recovery annealing that is performed immediately thereafter are performed (refer to FIG. 1H). Next, as illustrated in FIG. 7A, a resist pattern 97 having openings at predetermined positions is formed. At this time, the openings in the resist pattern 97 are set to be the same as the openings in the resist pattern 93. Then, etching of the aluminum oxide films 22 and 21 is performed with using the resist pattern 97 as a mask thereby forming the openings 61s positioned above the contact plugs 14s and the opening 61d positioned above the contact plug 14d.

Figure 7B:
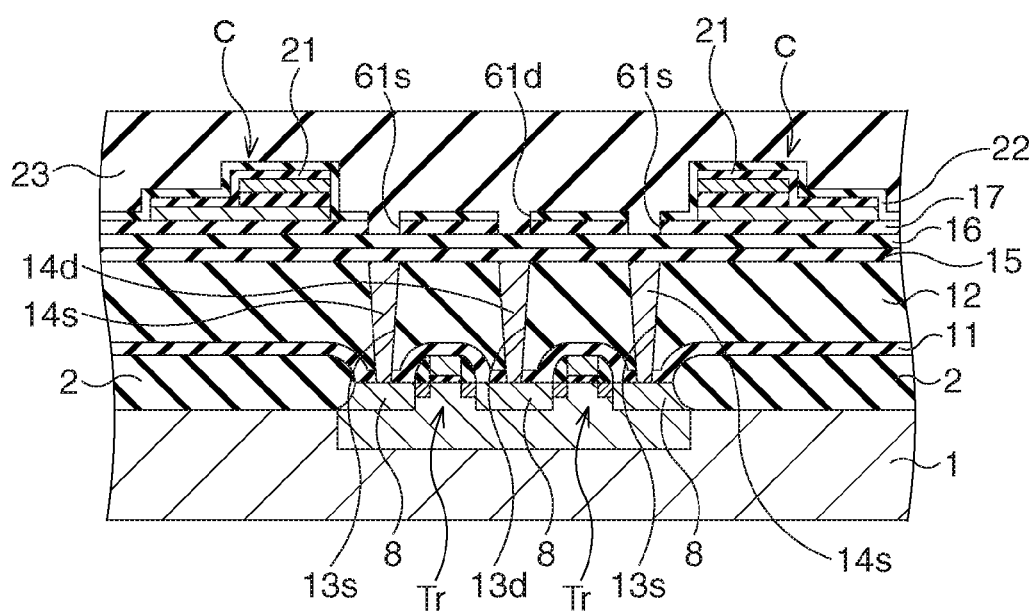

Next, as illustrated in FIG. 7B, the resist pattern 97 is removed, and the NSG film 23 whose thickness is approximately 1500 nm is formed on the aluminum oxide film 22 by a plasma CVD method using TEOS or the like, and the surface thereof is flattened.

Figure 7C:
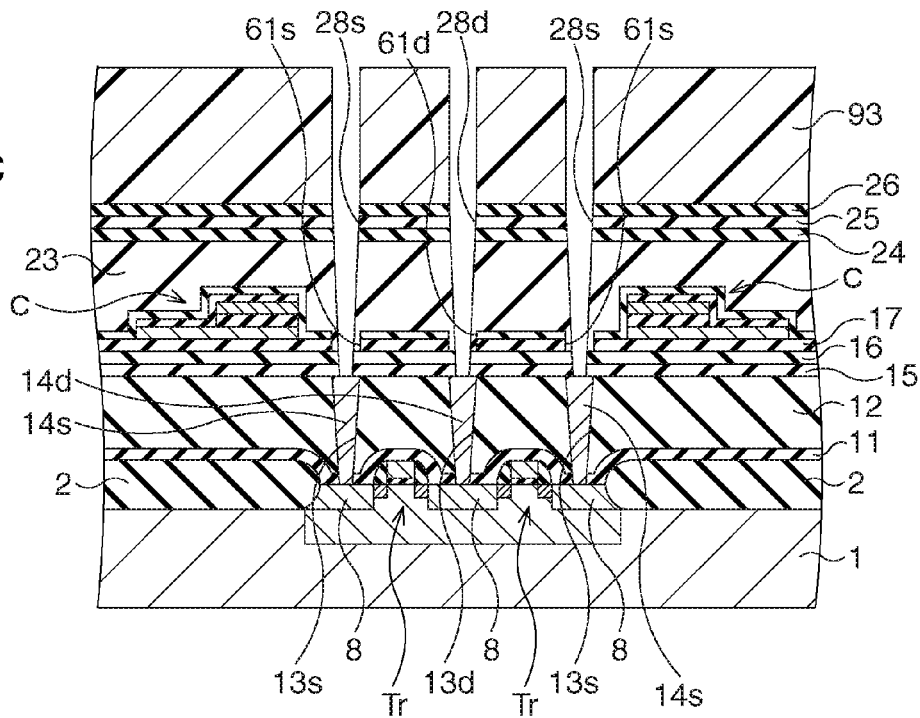

Next, as illustrated in FIG. 7C, similarly to the first embodiment, the processes from nitriding the surface of the NSG film 23 to forming the resist pattern 93 are performed. Then, etching of the NSG film 26 and so on is performed with using the resist pattern 93 as a mask thereby forming the contact holes 28s and 28d. At this time, similarly to the third embodiment, the openings 61s and 61d are formed in the aluminum oxide films 21 and 22, and therefore, the aluminum oxide films 21 and 22 are not required to be processed. Therefore, it becomes possible to form the contact holes 28s and 28d more easily than the first embodiment.

Figure 7D:
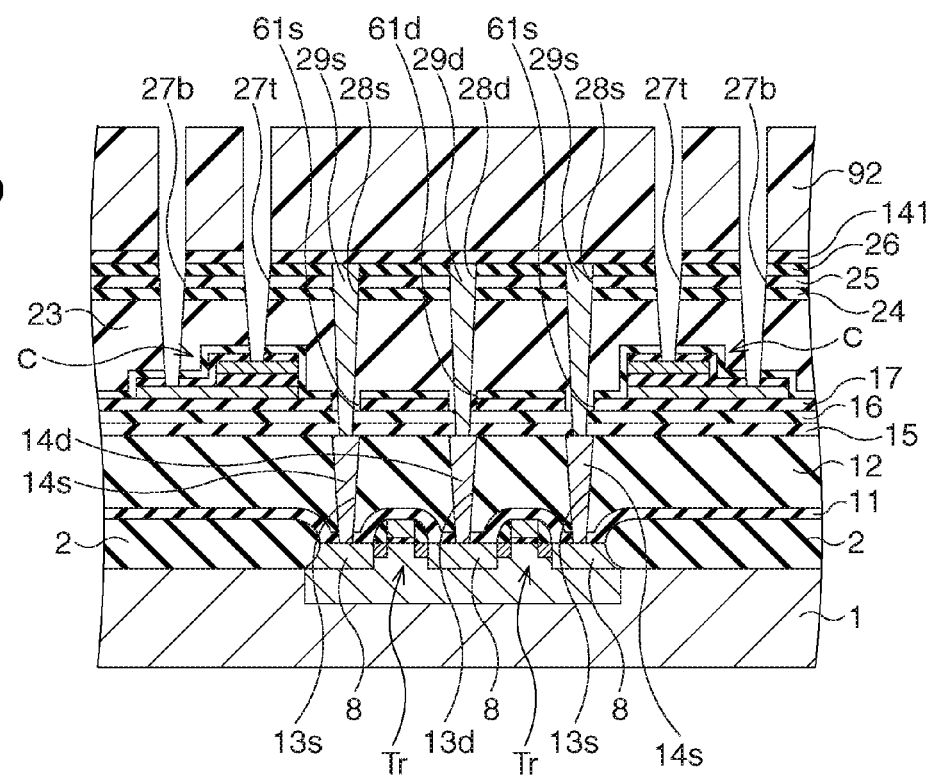

Subsequently, as illustrated in FIG. 7D, similarly to the first embodiment, the processes from removing the resist pattern 93 to forming the resist pattern 92 are performed. Next, etching of the NSG film 26 and so on is performed with using the resist pattern 92 as a mask thereby forming the contact holes 27t and 27b.

Thereafter, similarly to the first embodiment, the processes from the removal of the resist pattern 92 are performed.

According to the fifth embodiment, similarly to the third embodiment, etching for forming the contact holes 28s and 28d becomes easier, and the ferroelectric capacitor whose characteristics are further stable can be obtained.

-Sixth Embodiment-

Next, a sixth embodiment of the present invention will be explained. FIG. 8A to FIG. 8D are cross-sectional views showing a manufacturing method of a ferroelectric memory according to the sixth embodiment of the present invention in order of steps.

Figure 8A:
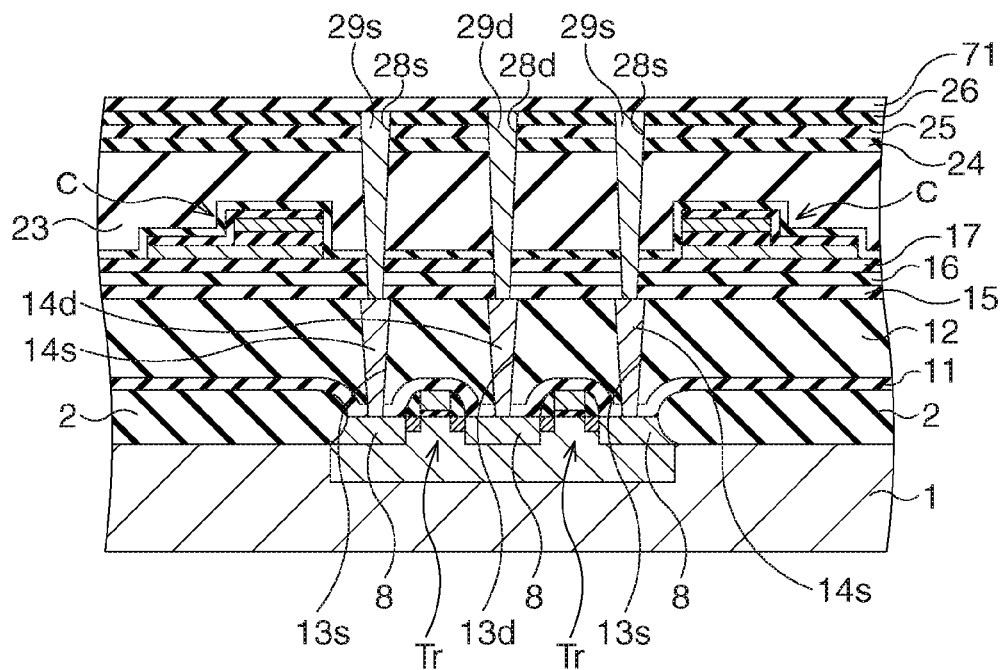
FIG. 8A to FIG. 8D are cross-sectional views showing a manufacturing method of a ferroelectric memory according to a sixth embodiment of the present invention in order of steps.

In the sixth embodiment, first, similarly to the first embodiment, the processes to the formation of the contact plugs 29s and 29d are performed. Next, as illustrated in FIG. 8A, a silicon oxynitride film 71 whose thickness is approximately 100 nm is formed on the entire surface by a plasma CVD method or the like as an oxidation preventing film for the contact plugs 29s and 29d.

Figure 8B:
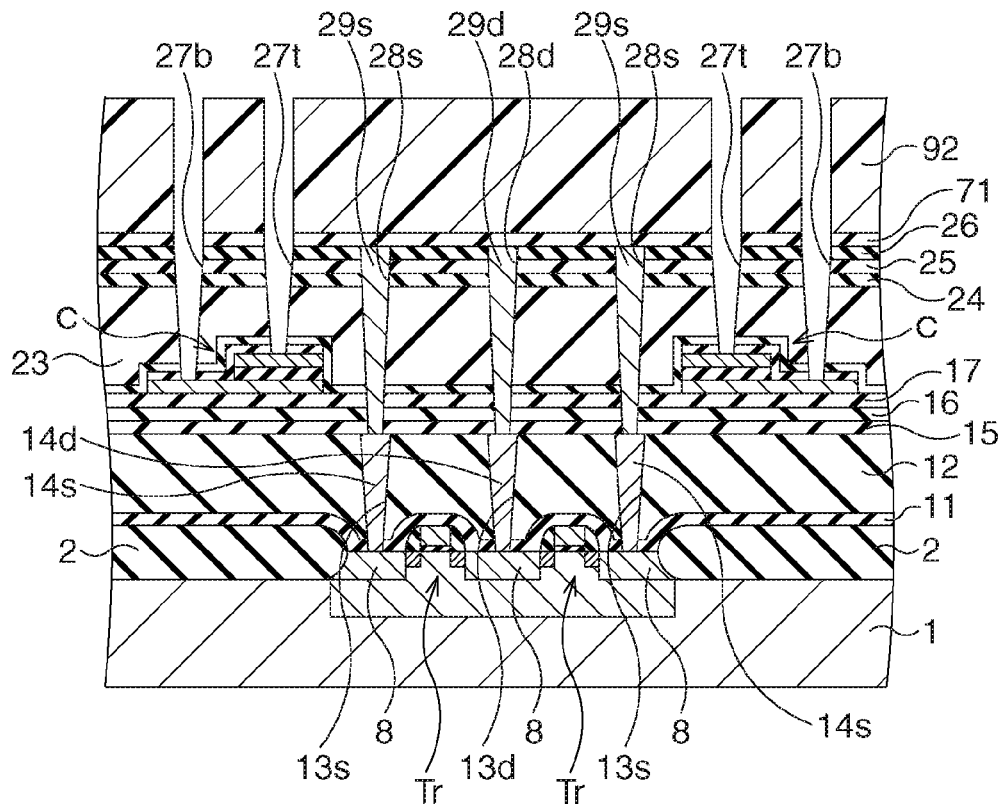

Next, as illustrated in FIG. 8B, the resist pattern 92 is formed on the silicon oxynitride film 71. Then, etching of the silicon oxynitride film 71 and so on is performed with using the resist pattern 92 as a mask thereby forming the contact holes 27t and 27b.

Figure 8C:
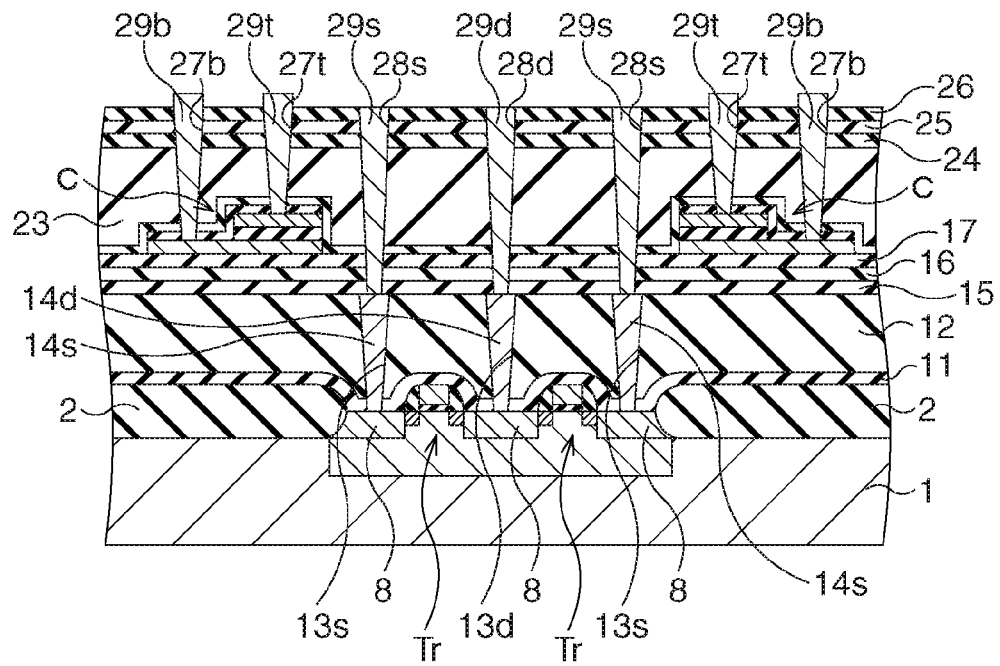

Next, as illustrated in FIG. 8C, the resist pattern 92 is removed, and then recovery annealing is performed. This recovery annealing may be set such that, for example, a vertical furnace is used, the temperature of the semiconductor substrate 1 is 500° C., the treatment time is for 60 minutes, and the supply amount of oxygen gas is 20 liters per minute. Thereafter, a barrier metal film (not-illustrated) whose thickness is approximately 70 nm is formed on the entire surface by, for example, a PVD method, and a tungsten film (not-illustrated) whose thickness is approximately 500 nm is formed thereon by, for example, a CVD method. Then, the tungsten film and the barrier metal film are polished by, for example, a CMP method until the silicon oxynitride film 71 is exposed. As a result, the contact plugs 29t and 29b are formed. Subsequently, etching back of the silicon oxynitride film 71 is performed. As a result, as illustrated in FIG. 8C, the contact plugs 29t and 29b protrude from the surface of the NSG film 26 only by the thickness of the silicon oxynitride film 71.

Figure 8D:
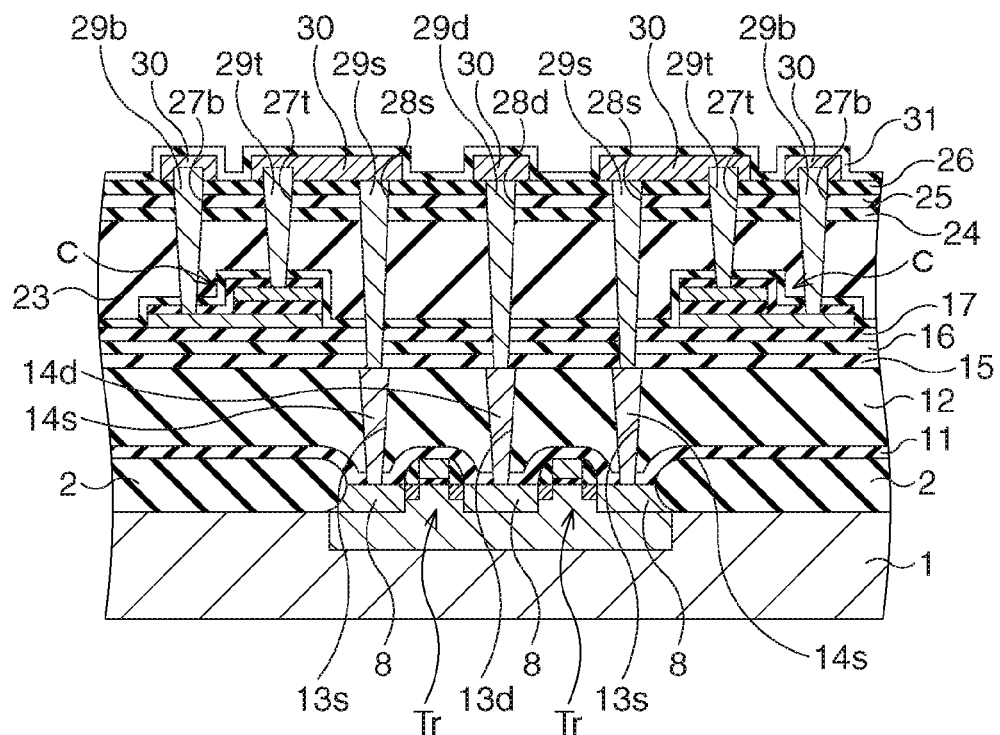
Figure 9A:
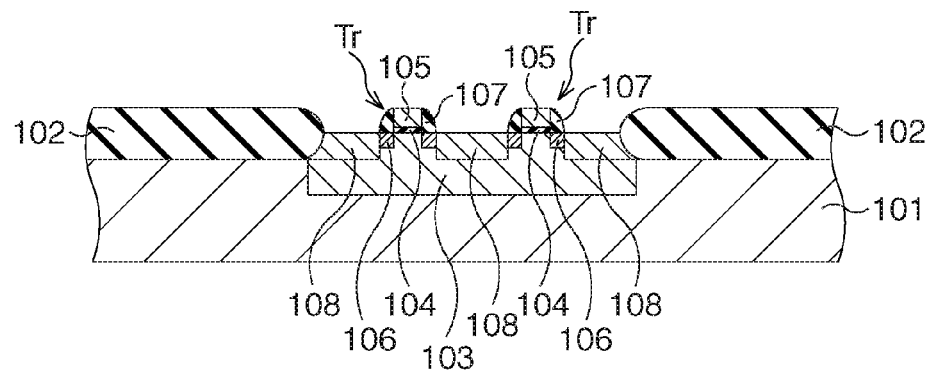
Figure 9B:
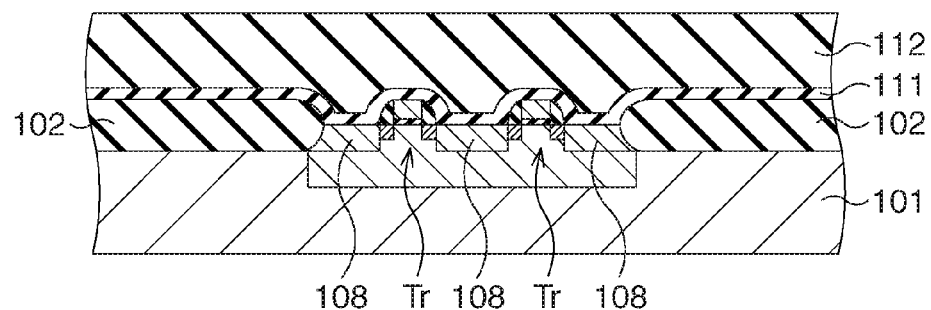
Figure 9C:
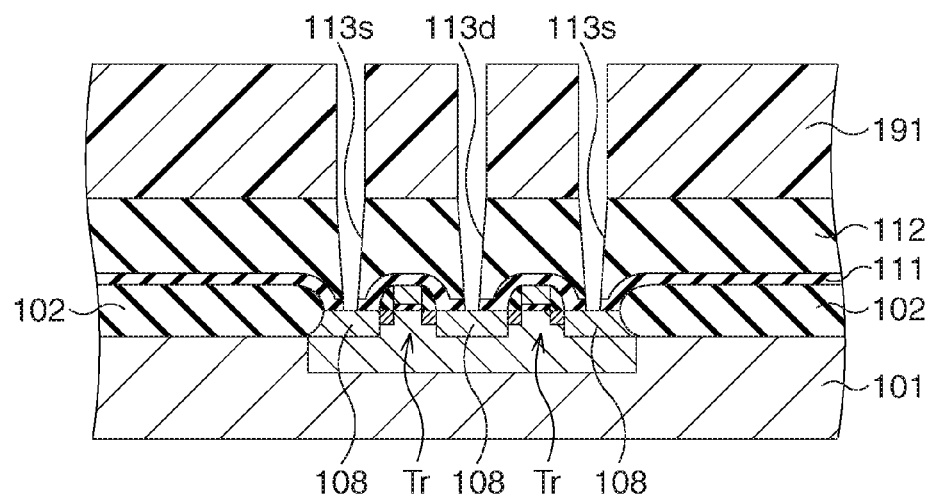
Figure 9D:
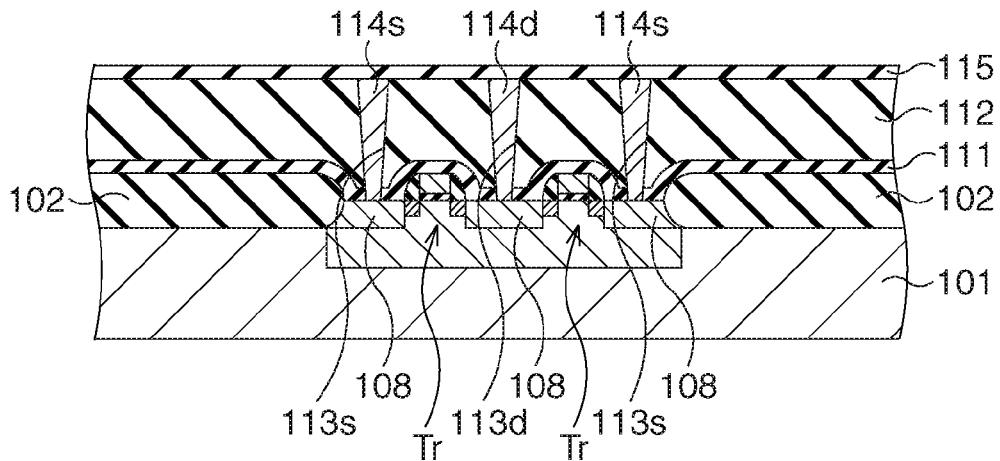
Figure 9E:
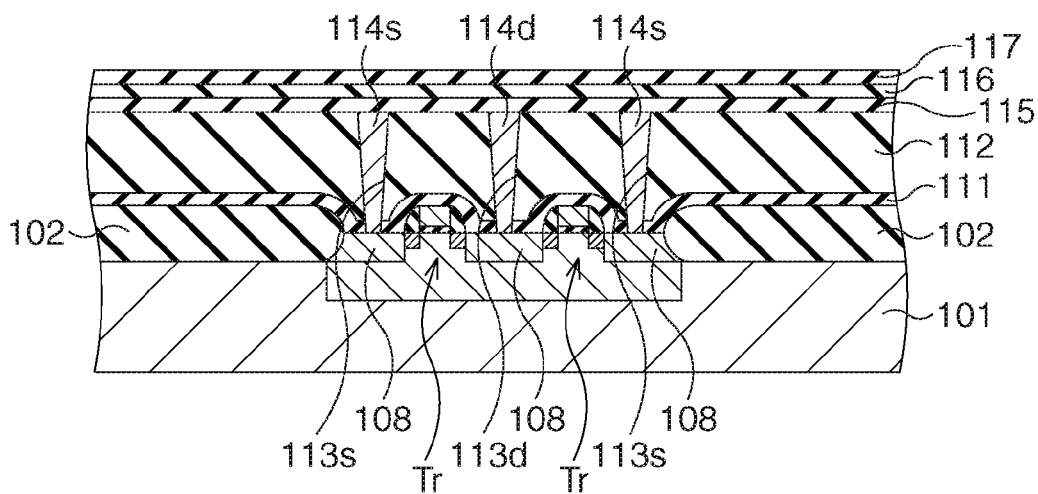
Figure 9F:
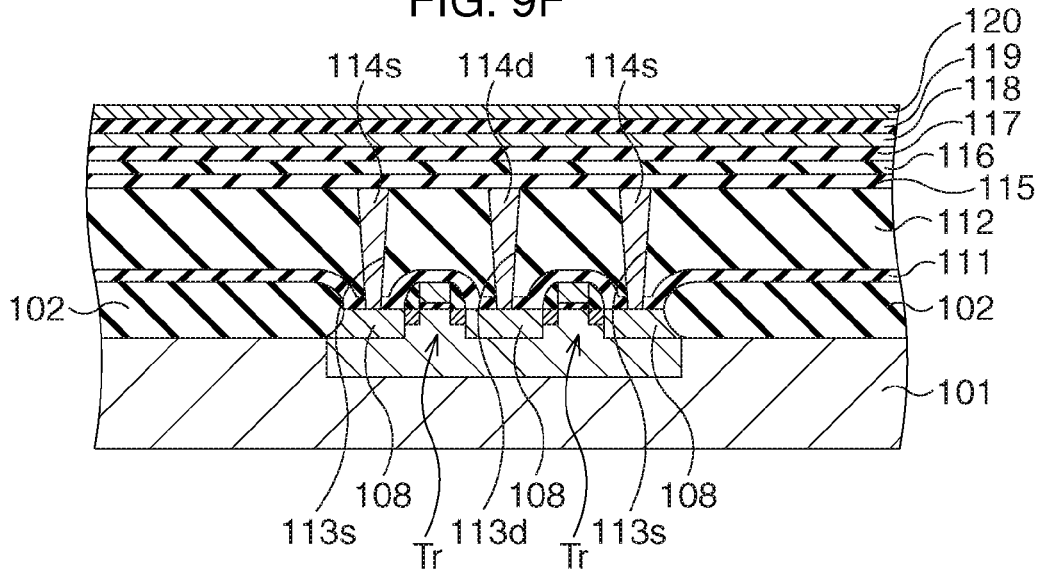
Figure 9J:
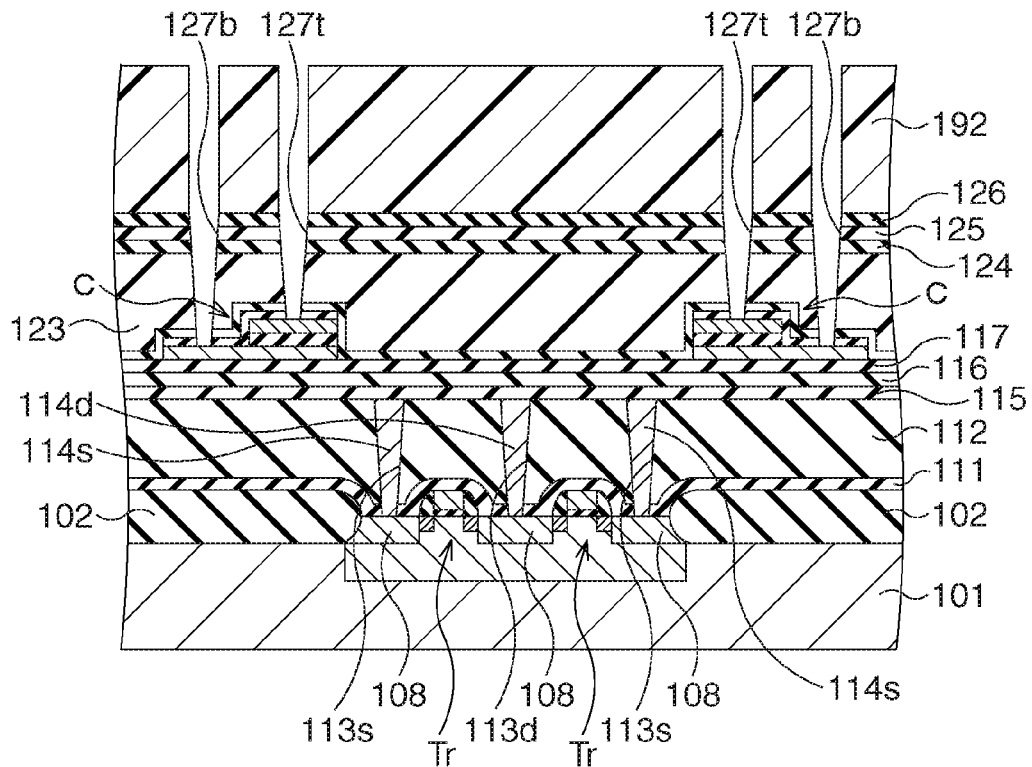
Figure 9K:
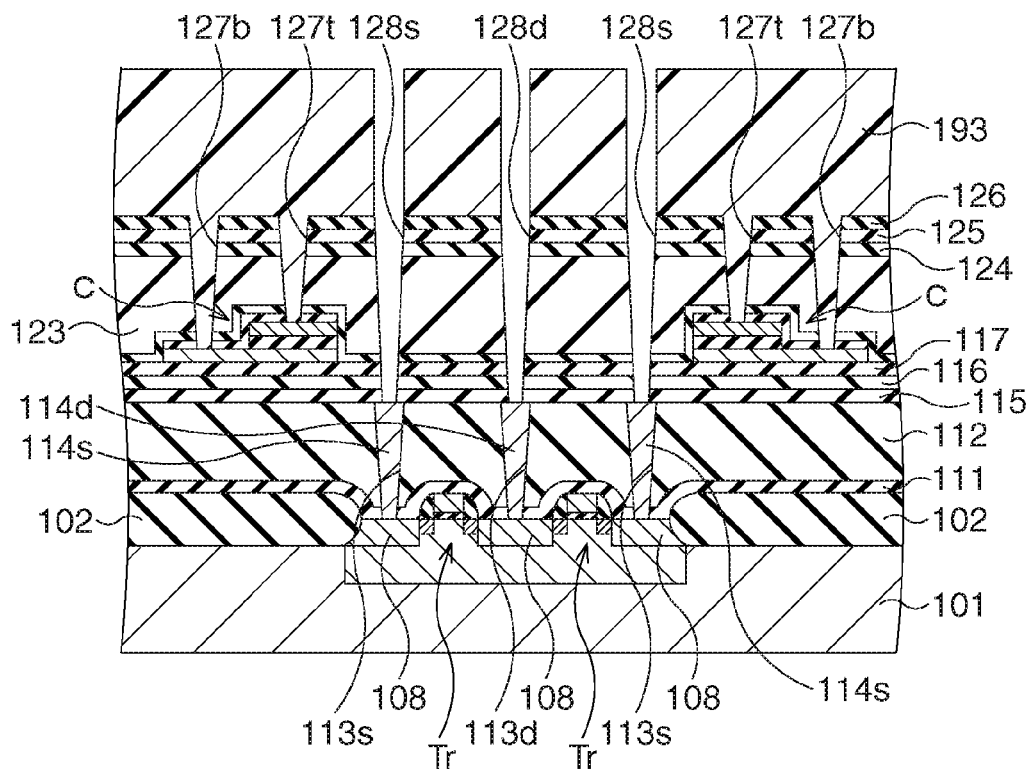
Figure 9L:
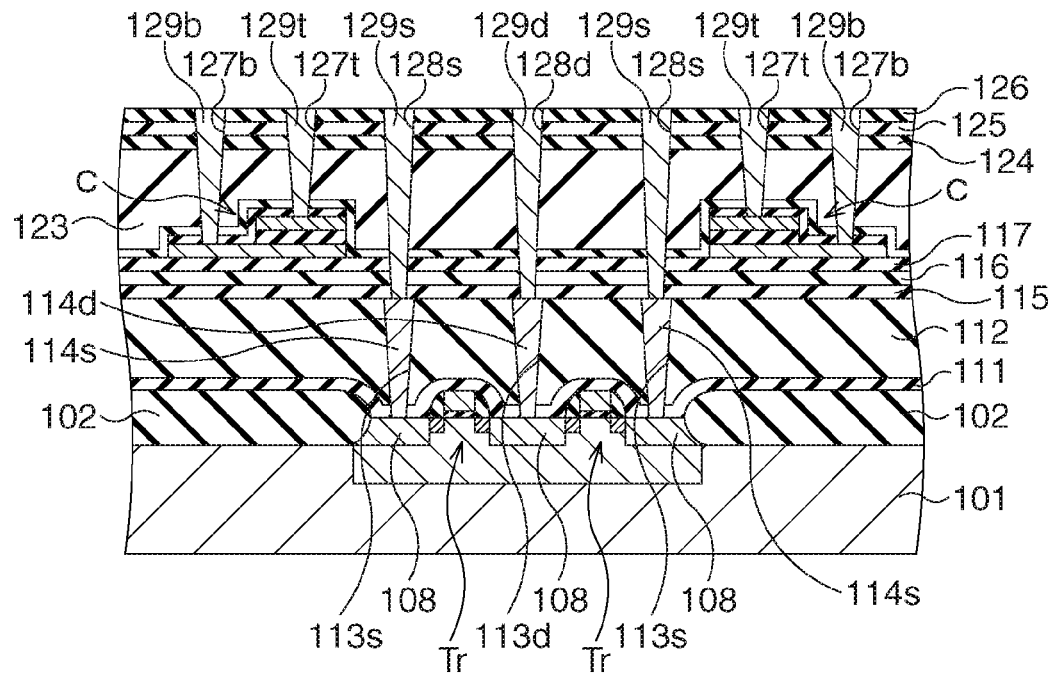
Figure 9M:
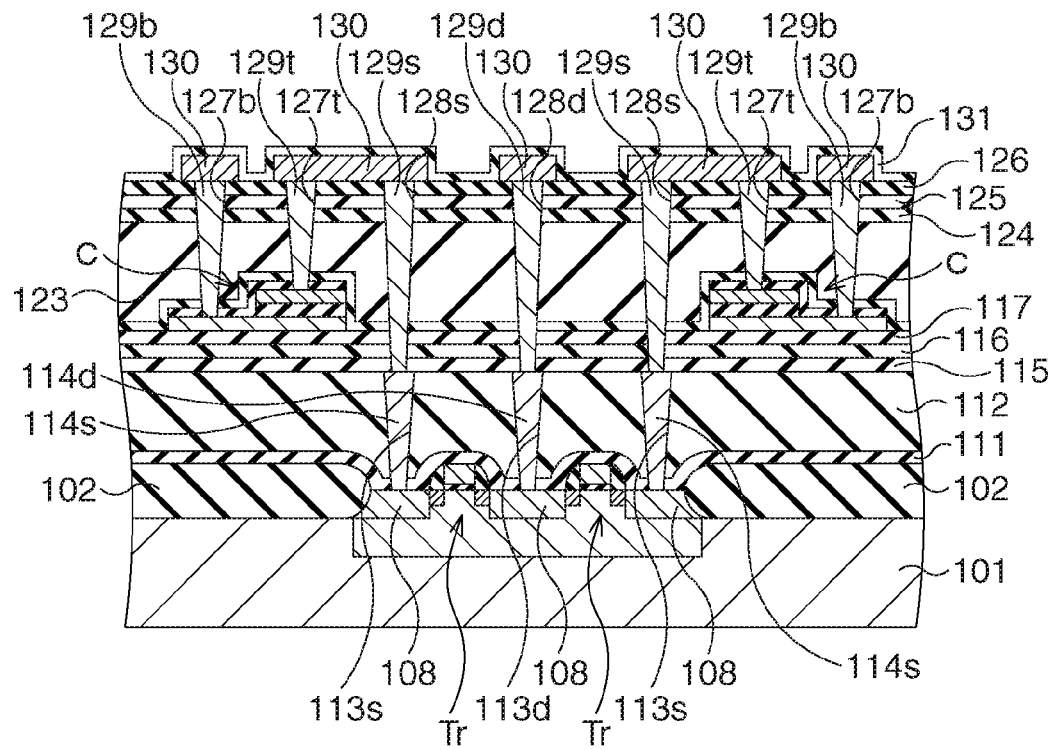
Figure 10A:
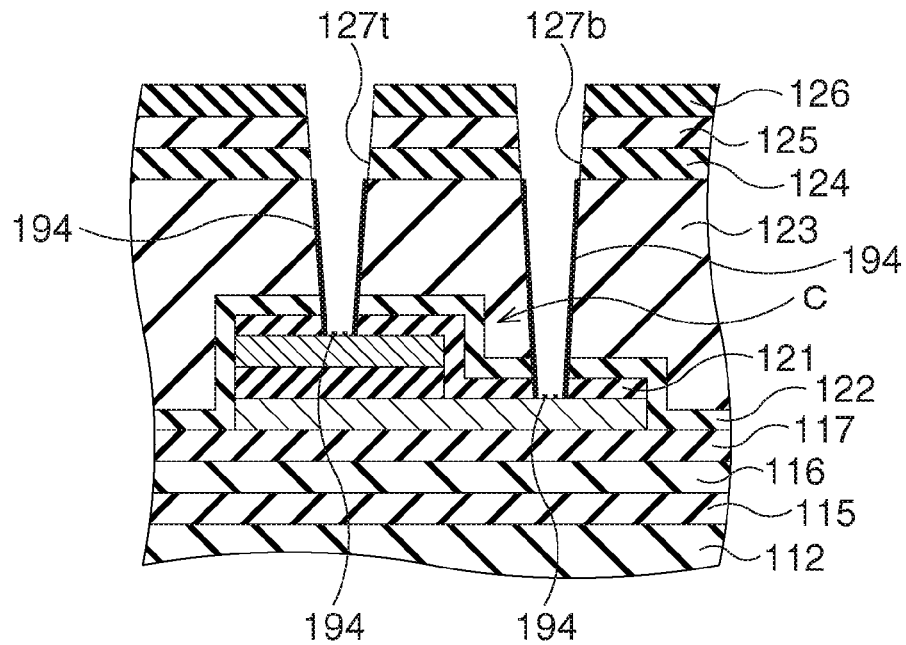
FIG. 10A is a cross-sectional view showing a state after a resist pattern 193 is removed in the conventional manufacturing method.
Figure 10B:
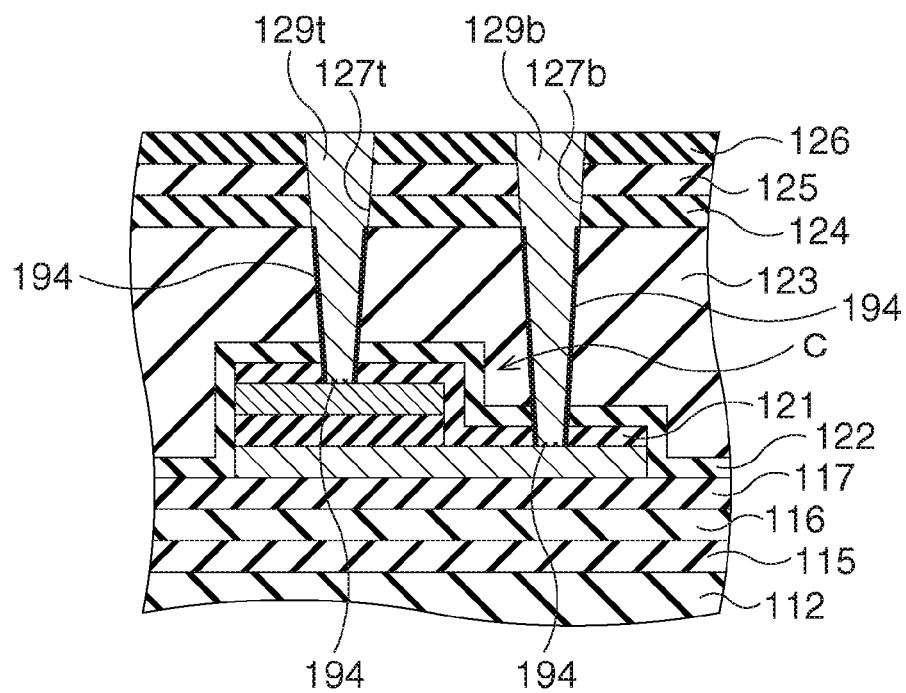
FIG. 10B is a cross-sectional view showing a state after contact plugs 129t and 129b are formed in the conventional manufacturing method.

Thereafter, as illustrated in FIG. 8D, similarly to the first embodiment, forming the wirings 30 and the aluminum oxide film 31 are performed. Then, the upper layer wirings and so on are formed.

In this manner, the silicon oxynitride film 71 can be used as the oxidation preventing film. Note that in the sixth embodiment, the aluminum oxide film 41 in the first embodiment is replaced with the silicon oxynitride film 71, but it is also possible to replace the aluminum oxide film 41 in the second and third embodiments with the silicon oxynitride film 71. Further, as the oxidation preventing film, a silicon nitride film may be formed by a plasma CVD method or the like. In the case of forming the silicon oxynitride film or the silicon nitride film, it is preferable to make the thickness thereof equal to or more than 100 nm. Further, as the oxidation preventing film, a titanium nitride film, an alloy nitride film such as a titanium aluminum nitride film, a noble metal film such as a platinum film or an iridium film, an oxide film of noble metal such as a platinum oxide film or an iridium oxide film, or the like may be formed. That is, in performing recovery annealing, the film that is not easily oxidized may be formed. It is preferable that the thickness of these is equal to or more than 50 nm.

Further, it is preferable that the thickness of the silicon oxynitride film 15 is equal to or more than 100 nm in the first to third embodiments and the sixth embodiment, and it is equal to or more than 150 nm in the fourth and fifth embodiments. This is because in the fourth and fifth embodiments the silicon oxynitride film 15 also functions as an etching stopper. Note that a silicon nitride film may be formed by a plasma CVD method or the like in place of the silicon oxynitride film 15. In this case, the thickness of the silicon nitride film may be set to be approximately the same as that of the silicon oxynitride film 15. Further, in place of the silicon oxynitride film 15, a metal oxide film such as an aluminum oxide film, a titanium oxide film, a zirconium oxide film, a magnesium oxide film, or a magnesium titanium oxide film may be formed. In this case, it is preferable that the thickness of the metal oxide film is equal to or more than 20 nm in the first to third embodiments and the sixth embodiment, and it is 50 nm to 100 nm in the fourth and fifth embodiments. If the thickness of the metal oxide film exceeds 100 nm, there is a possibility that subsequent processes will be difficult to be performed.

Further, in place of the aluminum oxide film 17, a metal oxide film such as a titanium oxide film, a zirconium oxide film, a magnesium oxide film, or a magnesium titanium oxide film may be used. It is preferable that the thickness of these (including the aluminum oxide film 17) is equal to or more than 20 nm.

Further, in any one of these embodiments, the material of the interlayer insulating film is not limited in particular, and a silicon oxide film except the NSG film or the like may be used. Further, the materials of the other films are not in particular limited to the materials in the above-described embodiments.

Further, in the first to third embodiments, and the sixth embodiment, it may be constituted such that forming the contact plugs 14s and 14d is omitted, and the contact plugs 28s and 28d may be formed to function as the contact plugs 14s and 14d.

Further, these embodiments can be also applied to a ferroelectric memory provided with a stack-type ferroelectric capacitor.

Here, an experiment that the present inventor conducts will be explained. In this experiment, two samples (samples No. 1 and No. 2) are made. The sample No. 1 is a ferroelectric memory manufactured by a conventional method illustrated in FIG. 9A to FIG. 9M. The sample No. 2 is the ferroelectric memory manufactured by the method according to the first embodiment illustrated in FIG. 1A to FIG. 1P.

Figure 11:
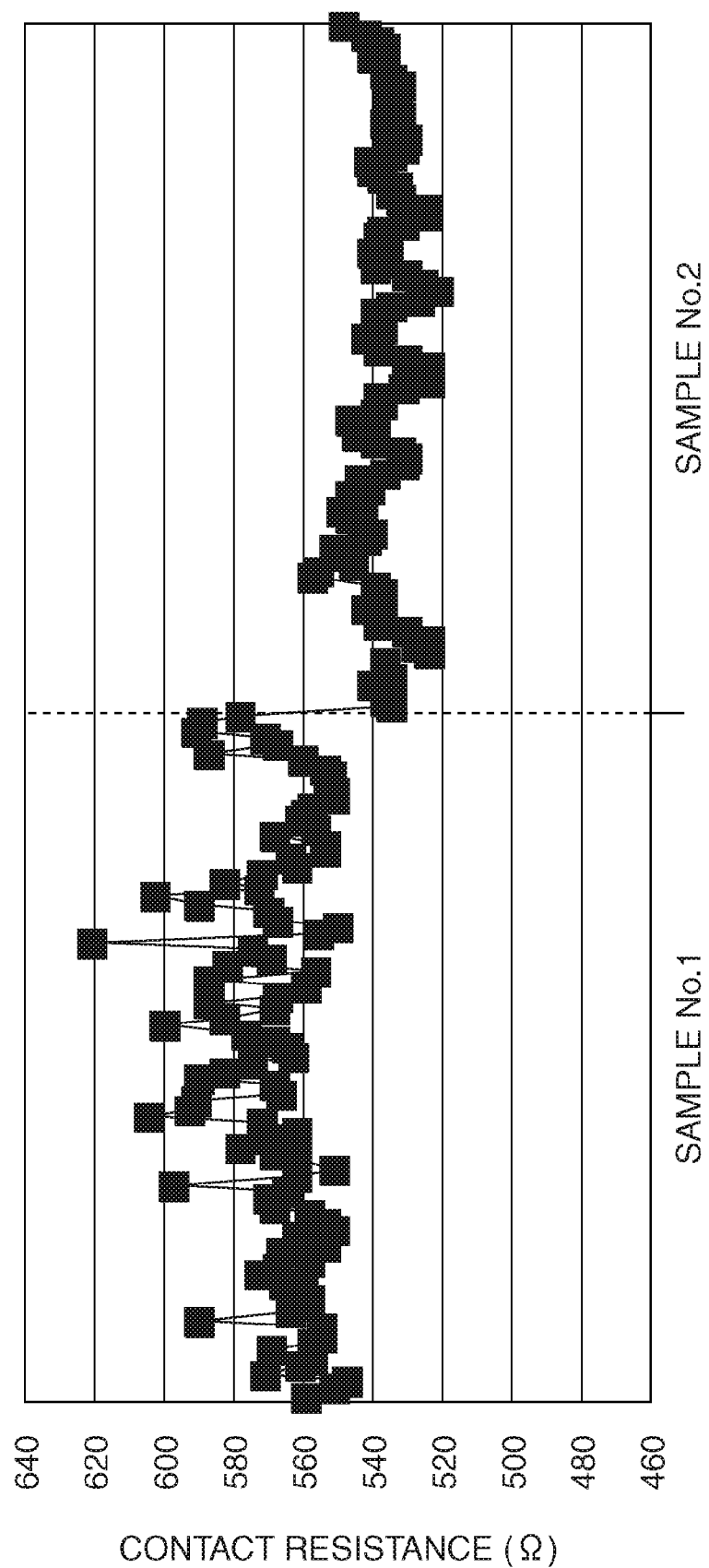
FIG. 11 is a graph showing contact resistance.
Figure 12:
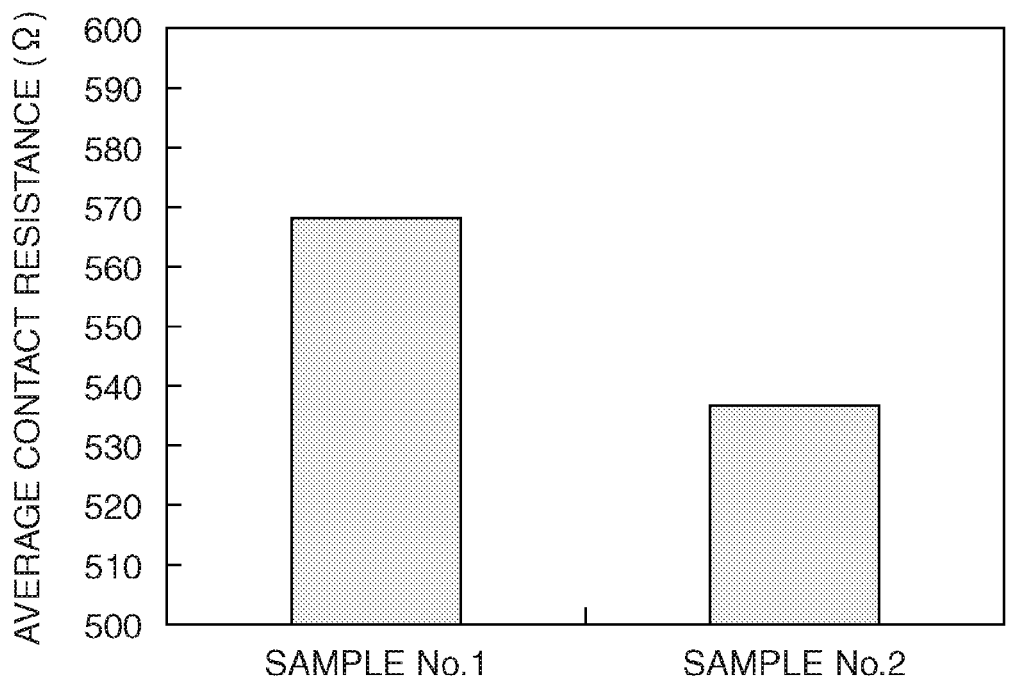
FIG. 12 is a graph showing average contact resistance.
Figure 13:
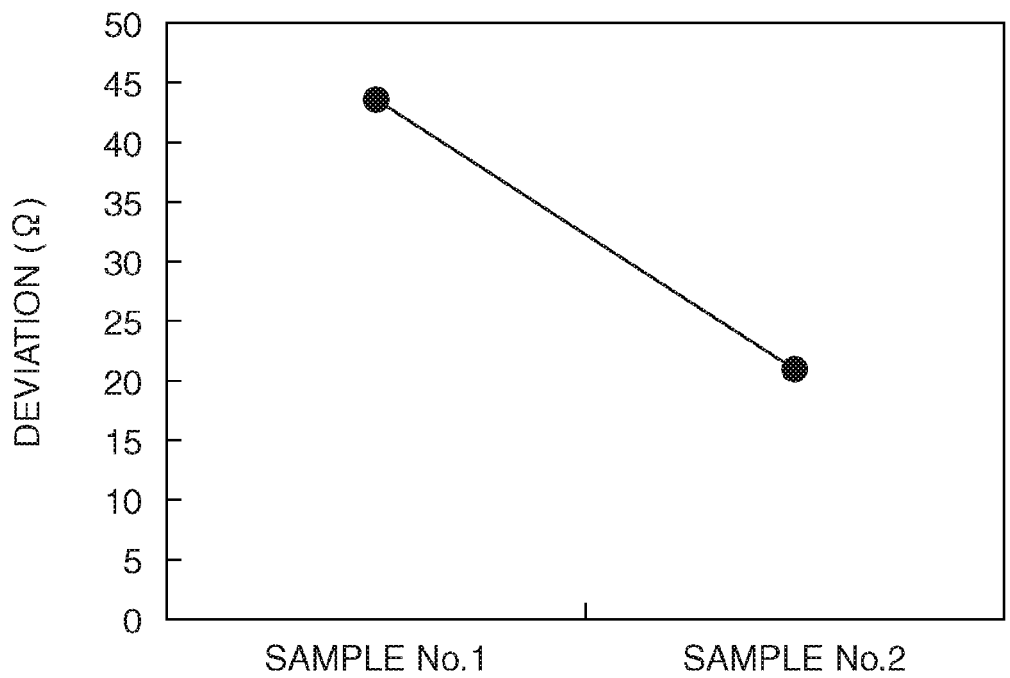
FIG. 13 is a graph showing deviation of contact resistance ($3\sigma$)

Then, as for these samples, contact resistance between the top electrode and the contact plug positioned thereon was measured at a plurality of positions on one wafer. FIG. 11 is a graph showing contact resistance, FIG. 12 is a graph showing average contact resistance, and FIG. 13 is a graph showing deviation of contact resistance ($3\sigma$). Further, an increase rate of contact resistance after an aging treatment was obtained. That is, the aging treatment, which was at 150° C. and for 96 hours, was performed, and the contact resistances measured before and after the aging treatment were compared. FIG. 14 is a graph showing an increase rate of contact resistance.

As illustrated in FIG. 11 to FIG. 13, in the sample No. 2, the contact resistance lower than that of the sample No. 1 was obtained. This means that, according to the first embodiment, the contact resistance can be suppressed lower than that of the ferroelectric memory manufactured by the conventional method. In the case when the contact resistance is low, a margin for characteristic fluctuation indicating relation between a threshold value of the transistor connected to the ferroelectric capacitor and on-current can be secured widely. Consequently, a yield can be improved.

Further, as illustrated in FIG. 14, in the sample No. 2, the increase rate of contact resistance was lower than that of the sample No. 1. This means that, according to the first embodiment, the increase rate of contact resistance can be suppressed lower than that of the ferroelectric memory manufactured by the conventional method. In the case when the increase rate of contact resistance is low, reliability with respect to use for a long time is high. Note that in the conventional art such as the sample No. 1, it is considered that a residue in the contact hole is combined with oxygen or the like during the aging treatment, and therefore the resistance is high.

Industrial Applicability

According to the present invention, due to existence of a hydrogen barrier film such as an aluminum oxide film, resistance of a ferroelectric capacitor to hydrogen diffusion can be increased. Further, the order of each step is defined appropriately. Thereby, even when a hydrogen barrier film is provided, a shape of a conductive plug or the like is stabilized, and stable characteristics can be obtained.

What is claimed is:

1. A manufacturing method of a semiconductor device comprising:
    forming a ferroelectric capacitor above a semiconductor substrate;
    forming a first hydrogen barrier film directly on the ferroelectric capacitor;
    forming a first opening where a portion of an electrode of the ferroelectric capacitor is exposed in the first hydrogen barrier film;
    after the forming the first opening, forming a first insulating film whose surface is flat on the first hydrogen barrier film;
    forming a second hydrogen barrier film directly on the first insulating film;
    forming a second insulating film on the second hydrogen barrier film;
    forming a first conductive plug in contact with the semiconductor substrate through the second insulating film, the second hydrogen barrier film, and the first insulting film;
    forming an oxidation preventing film on the first conductive plug and the second insulating film; and
    forming a second conductive plug in contact with the electrode of the ferroelectric capacitor through the oxidation preventing film, the second insulating film, the second hydrogen barrier film, the first insulating film, and the first opening,
    wherein
    the manufacturing method further comprises, before the forming the ferroelectric capacitor:
        forming a third insulating film whose surface is flat above the semiconductor substrate;
        forming a third conductive plug in contact with the semiconductor substrate in the third insulating film;
        forming a fourth insulating film on the third insulating film and the third conductive plug; and
        thinning a portion of the fourth insulating film in a region above the third conductive plug contemporaneously with the time period in which the first opening is formed, and
        the ferroelectric capacitor is formed on the fourth insulating film.

2. The manufacturing method of a semiconductor device according to claim 1, wherein the forming the second conductive plug comprises:
    forming a second opening reaching the electrode in the oxidation preventing film, the second insulating film, the second hydrogen barrier film, the first insulating film, and the first opening;
    forming a conductive film in the second opening and on the oxidation preventing film; and
    polishing the conductive film until the second insulating film is exposed.

3. The manufacturing method of a semiconductor device according to claim 1, wherein the forming the second conductive plug comprises:
    forming a second opening reaching the electrode in the oxidation preventing film, the second insulating film, the second hydrogen barrier film, the first insulating film, and the first opening;
    forming a conductive film in the second opening and on the oxidation preventing film;
    polishing the conductive film until the oxidation preventing film is exposed; and
    removing the oxidation preventing film.

4. The manufacturing method of a semiconductor device according to claim 1, wherein a thickness of the second hydrogen barrier film is set to be equal to or more than 20 nm.

5. The manufacturing method of a semiconductor device according to claim 1, wherein the forming the second conductive plug comprises:
    forming a second opening reaching the electrode in the oxidation preventing film, the second insulating film, the second hydrogen barrier film, the first insulating film, and the first opening;
    forming a conductive film in the second opening and on the oxidation preventing film; and
    polishing the conductive film until the second insulating film is exposed.

6. The manufacturing method of a semiconductor device according to claim 1, wherein the forming the second conductive plug comprises:
    forming a second opening reaching the electrode in the oxidation preventing film, the second insulating film, the second hydrogen barrier film, the first insulating film, and the first opening;
    forming a conductive film in the second opening and on the oxidation preventing film;
    polishing the conductive film until the oxidation preventing film is exposed; and
    removing the oxidation preventing film.

7. The manufacturing method of a semiconductor device according to claim 1, wherein a thickness of the second hydrogen barrier film is set to be equal to or more than 20 nm.

8. The manufacturing method of a semiconductor device according to claim 1, wherein the forming the second conductive plug comprises:
    forming a second opening reaching the electrode in the oxidation preventing film, the second insulating film, the second hydrogen barrier film, the first insulating film, and the first opening;
    forming a conductive film in the second opening and on the oxidation preventing film; and polishing the conductive film until the second insulating film is exposed.

9. The manufacturing method of a semiconductor device according to claim 1, wherein the forming the second conductive plug comprises:
   forming a second opening reaching the electrode in the oxidation preventing film, the second insulating film, the second hydrogen barrier film, the first insulating film, and the first opening;
   forming a conductive film in the second opening and on the oxidation preventing film;
   polishing the conductive film until the oxidation preventing film is exposed; and
   removing the oxidation preventing film.

10. The manufacturing method of a semiconductor device according to claim 1, wherein a thickness of the second hydrogen barrier film is set to be equal to or more than 20 nm.

11. A manufacturing method of a semiconductor device comprising:
   forming a third insulating film whose surface is flat above a semiconductor substrate;
   forming a third conductive plug in contact with the semiconductor substrate in the third insulating film;
   forming a fourth insulating film on the third insulating film and the third conductive plug;
   forming a ferroelectric capacitor on the fourth insulating film;
   forming a first hydrogen barrier film directly on the ferroelectric capacitor;
   thinning a portion of the fourth insulating film in a region above the third conductive plug;
   forming a first opening where a portion of an electrode of the ferroelectric capacitor is exposed in the first hydrogen barrier film;
   after the forming the first opening, forming a first insulating film whose surface is flat on the first hydrogen barrier film;
   forming a second hydrogen barrier film directly on the first insulating film;
   forming a second insulating film on the second hydrogen barrier film; and
   forming a first conductive plug in contact with the semiconductor substrate in the second insulating film, the second hydrogen barrier film, the first insulating film, and the fourth insulating film; and
   forming a second conductive plug in contact with an electrode of the ferroelectric capacitor through the second insulating film, the second hydrogen barrier film, the first insulating film, and the first opening,
   wherein
   the forming the first and second conductive plugs comprises:
      forming a second opening reaching the third conductive plug in the second insulating film, the second hydrogen barrier film, the first insulating film, the first hydrogen barrier film, and the fourth insulating film, and forming a third opening reaching the electrode in the second insulating film, the second hydrogen barrier film, the first insulating film, and the first opening;
      forming a conductive film in the second and third openings and on the second insulating film; and
      polishing the conductive film until the second insulating film is exposed, and
   in the forming the second and third openings,
      after the second opening reaches the fourth insulating film, recovery annealing of the ferroelectric capacitor is performed via the third opening, and
      the second opening is next made to reach the third conductive plug.

12. The manufacturing method of a semiconductor device according to claim 11, wherein a thickness of the second hydrogen barrier film is set to be equal to or more than 20 nm.

13. A manufacturing method of a semiconductor device comprising:
   forming a third insulating film whose surface is flat above a semiconductor substrate;
   forming a third conductive plug in contact with the semiconductor substrate in the third insulating film;
   forming a fourth insulating film on the third insulating film and the third conductive plug;
   forming a ferroelectric capacitor on the fourth insulating film;
   forming a first hydrogen barrier film directly on the ferroelectric capacitor;
   thinning a portion of the fourth insulating film in a region above the third conductive plug;
   forming a first opening where a portion of an electrode of the ferroelectric capacitor is exposed in the first hydrogen barrier film;
   after the forming the first opening, forming a first insulating film whose surface is flat on the first hydrogen barrier film;
   forming a second hydrogen barrier film directly on the first insulating film;
   forming a second insulating film on the second hydrogen barrier film; and
   forming a first conductive plug in contact with the semiconductor substrate in the second insulating film, the second hydrogen barrier film, the first insulating film, and the fourth insulating film; and
   forming a second conductive plug in contact with an electrode of the ferroelectric capacitor through the second insulating film, the second hydrogen barrier film, the first insulating film, and the first opening,
   wherein
   in thinning the portion of the fourth insulating film, at least a portion where the second conductive plug is formed of the first hydrogen barrier film is removed to form the first opening,
   the forming the first and second conductive plugs comprises:
      forming a second opening reaching the third conductive plug in the second insulating film, the second hydrogen barrier film, the first insulating film, the first hydrogen barrier film, and the fourth insulating film, and forming a third opening reaching the electrode in the second insulating film, the second hydrogen barrier film, the first insulating film, and the first opening;
      forming a conductive film in the second and third openings and on the second insulating film; and
      polishing the conductive film until the second insulating film is exposed, and
   in the forming the second and third openings,
      after the second opening reaches the fourth insulating film, recovery annealing of the ferroelectric capacitor is performed via the third opening, and
      the second opening is next made to reach the third conductive plug.

14. The manufacturing method of a semiconductor device according to claim 13, wherein a thickness of the second hydrogen barrier film is set to be equal to or more than 20 nm.

* * * * *